(12) United States Patent
Zhang

(10) Patent No.: US 9,716,508 B1
(45) Date of Patent: Jul. 25, 2017

(54) DUMMY SIGNAL GENERATION FOR REDUCING DATA DEPENDENT NOISE IN DIGITAL-TO-ANALOG CONVERTERS

(71) Applicant: ANALOG DEVICES GLOBAL, Hamilton (BM)

(72) Inventor: Lin Zhang, Beijing (CN)

(73) Assignee: ANALOG DEVICES GLOBAL, Hamilton (BM)

( * ) Notice: Subject to any disclaimer, the term of this patent is extended or adjusted under 35 U.S.C. 154(b) by 0 days.

(21) Appl. No.: 15/150,833

(22) Filed: May 10, 2016

(30) Foreign Application Priority Data

Mar. 28, 2016 (CN) ................. PCT/CN2016/077525

(51) Int. Cl.
*H03M 1/06* (2006.01)
*H03M 1/08* (2006.01)
*H03M 1/66* (2006.01)

(52) U.S. Cl.
CPC ............... *H03M 1/08* (2013.01); *H03M 1/66* (2013.01)

(58) Field of Classification Search
CPC ............. H03M 1/0678; H03M 1/0675; H03M 1/0617; H03M 1/08; H03M 1/66
USPC ................ 341/144, 118, 110, 120
See application file for complete search history.

(56) References Cited

U.S. PATENT DOCUMENTS

| 5,856,799 | A | * | 1/1999 | Hamasaki | H03M 1/0663 341/118 |
| 6,344,816 | B1 | | 2/2002 | Dedic | |
| 6,768,438 | B1 | | 7/2004 | Schofield et al. | |
| 2004/0108945 | A1 | * | 6/2004 | Hori | H04L 25/4915 341/63 |
| 2007/0195828 | A1 | * | 8/2007 | Matsumoto | H04L 5/0046 370/498 |
| 2009/0304030 | A1 | * | 12/2009 | Schmidt | H04B 1/707 370/476 |

OTHER PUBLICATIONS

T. Rueger et al., *A 110dB Ternary PWM Current-Mode Audio DAC with Monolithic 2Vrms Driveri*, ISSCC 2004, Session 20, Digital-to-Analog Converters, 20.7, Feb. 18, 2004, Salon 8, 10 pages.

* cited by examiner

*Primary Examiner* — Peguy Jean Pierre
(74) *Attorney, Agent, or Firm* — Patent Capital Group

(57) ABSTRACT

Mechanisms for generating dummy signals for use in reducing data dependent noise in DACs are disclosed. Disclosed mechanisms differentiate between odd and even bits of a digital data signal to be converted and generate dummy signals by inverting some of these bits and leaving other bits as they are (i.e. including them in their non-inverted form). One dummy signal is generated as a sequence of bits that is the same as a sequence of bits of a data signal except that every odd bit of the data signal is inverted. An alternative dummy signal is generated as a sequence of bits that is the same as a sequence of bits of a data signal except that every even bit is inverted. Generating dummy signals in this manner eliminates the need to use calibration, feedback, or transition detectors, advantageously resulting in increased timing margins and substantial power savings over existing implementations.

30 Claims, 14 Drawing Sheets

DUMMY SIGNAL GENERATION FOR REDUCING DATA DEPENDENT NOISE IN DIGITAL-TO-ANALOG CONVERTERS

TECHNICAL FIELD OF THE DISCLOSURE

This application is a non-provisional application and claims benefit to PCT Application Serial No. PCT/CN2016/077525, filed Mar. 28, 2016 entitled "DUMMY SIGNAL GENERATION FOR REDUCING DATA DEPENDENT NOISE IN DIGITAL-TO-ANALOG CONVERTERS", which is incorporated herein by reference in its entirety.

TECHNICAL FIELD OF THE DISCLOSURE

The present disclosure relates generally to digital-to-analog converters and, more particularly, to methods and systems for generating dummy signals to be used in reducing or eliminating data dependent noise in digital-to-analog converters.

BACKGROUND

Real-world analog signals such as temperature, pressure, sound, or images are routinely converted to a digital representation that can be easily processed in modern digital systems. In many systems, this digital information must be converted back to an analog form to perform some real-world function. The circuits that perform this step are digital-to-analog converters (DACs), and their outputs are used to drive a variety of devices. Loudspeakers, video displays, motors, mechanical servos, radio frequency (RF) transmitters, and temperature controls are just a few diverse examples. DACs are often incorporated into digital systems in which real-world signals are digitized by analog-to-digital converters (ADCs), processed, and then converted back to analog form by DACs. In these systems, the performance required of the DACs will be influenced by the capabilities and requirements of the other components in the system.

In theory, a DAC can operate at any frequency to provide an analog output corresponding to the digital data input. However, in the real world, errors and noise occur throughout the system, the effects of which increase with operating frequency. These effects may be code dependent and may result in harmonic distortion and harmonic spurs in the analog output signal. Improvements could be made with respect to addressing this issue.

BRIEF DESCRIPTION OF THE DRAWINGS

To provide a more complete understanding of the present disclosure and features and advantages thereof, reference is made to the following description, taken in conjunction with the accompanying figures, wherein like reference numerals represent like parts, in which.

DESCRIPTION OF EXAMPLE EMBODIMENTS OF THE DISCLOSURE

Figure 1:
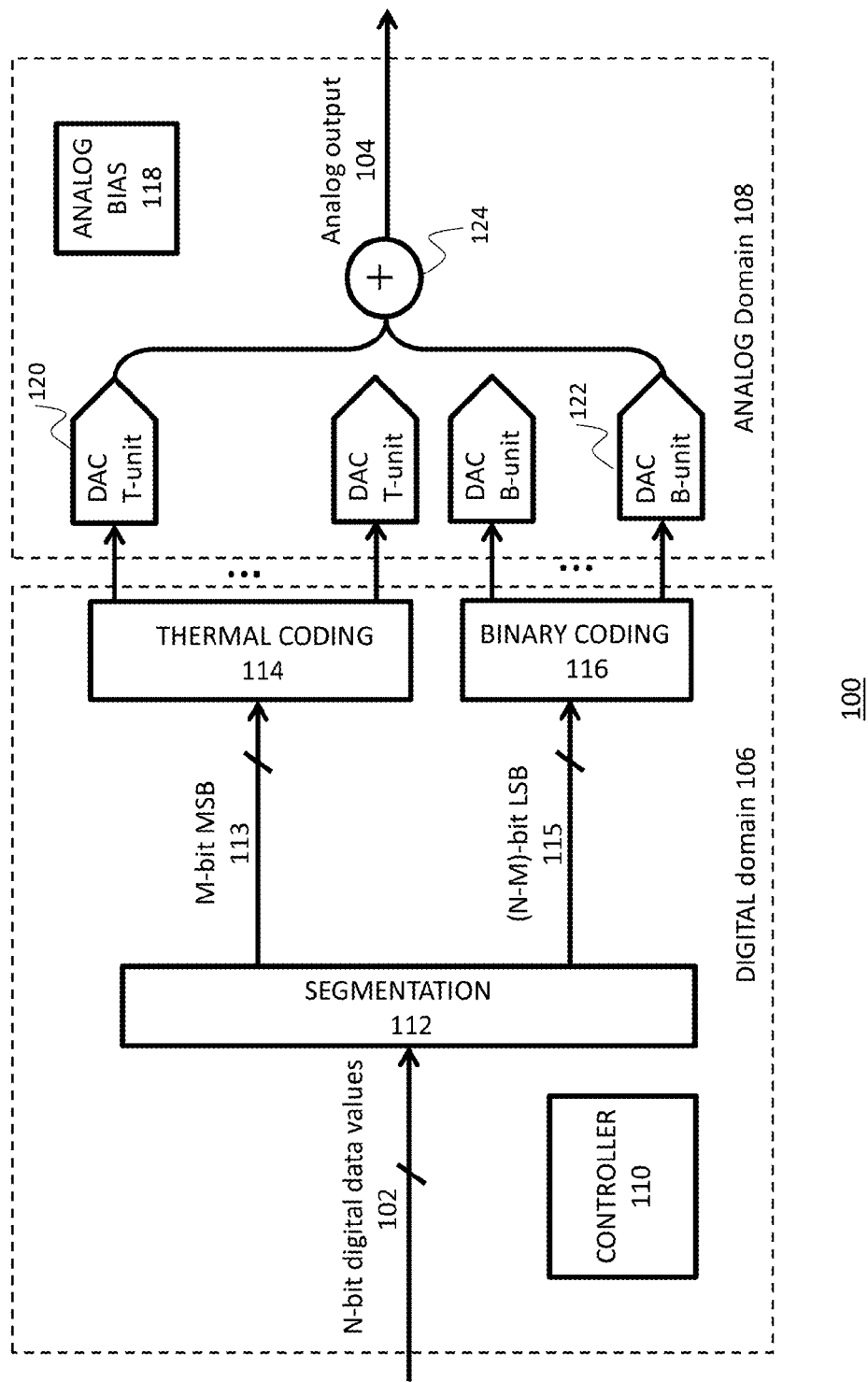
FIG. 1 provides a schematic illustration of an exemplary segmented DAC system, according to some embodiments of the disclosure.

Present disclosure relates to improved systems and methods for generating dummy signals that can be used to reduce or eliminate data dependent noise in DACs. Various embodiments are based on recognition that appropriate dummy signals may be generated by differentiating between odd and even bits of a digital data signal to be converted and generating dummy signals by inverting some of these bits and leaving other bits as they are (i.e. including them in the dummy signals without inverting them). In particular, one dummy signal may be generated as a sequence of bits that is the same as a sequence of bits of a data signal except that every odd bit of the data signal is inverted in the sequence of the dummy signal (thus every even bit in such a dummy sequence is included as is, i.e. every even bit of the sequence of the dummy signal includes a corresponding non-inverted even bit of the data signal). Alternatively, a dummy signal may be generated as a sequence of bits that is the same as a sequence of bits of a data signal except that every even bit of the data signal is inverted in the sequence of the dummy signal (thus every odd bit in such a dummy sequence is included as is, i.e. every odd bit of the sequence of the dummy signal includes a corresponding non-inverted odd bit of the data signal). Generating dummy signals in this manner eliminates the need to use calibration, feedback, or transition detectors, advantageously resulting in increased timing margins and substantial power savings over prior art implementations. Any one of the dummy signals generated as described herein may then be used, synchronously with the data signal, as is known in the art in order to reduce data dependent noise of a DAC.

Because mechanisms, including circuits, methods, and processing logic, described herein involve generation of dummy signals, these mechanisms may be referred to as "dummy signal generation" mechanisms. Such mechanisms may be applicable to continuous-time implementations, and may be especially attractive for high-speed applications.

As will be appreciated by one skilled in the art, aspects of the present disclosure, in particular aspects of various dummy signal generation mechanisms, may be embodied in various manners—e.g. as methods, systems, computer program products, or computer-readable storage media. Accordingly, aspects of the present disclosure related to dummy signal generation may take the form of an entirely hardware embodiment, an entirely software embodiment (including firmware, resident software, micro-code, etc.) or an embodiment combining software and hardware aspects that may all generally be referred to herein as a "circuit," "module" or "system." Functions described in this disclosure may be implemented as an algorithm executed by one or more processing units, e.g. one or more microprocessors, of one or more computers. In various embodiments, different steps and portions of the steps of each of the methods described herein may be performed by different processing units. Furthermore, aspects of the present disclosure may take the form of a computer program product embodied in one or more computer readable medium(s), preferably non-transitory, having computer readable program code embodied, e.g., stored, thereon. In various embodiments, such a computer program may, for example, be downloaded (updated) to the existing devices and systems (e.g. to the existing DACs or their controllers, etc.) or be stored upon manufacturing of these devices and systems.

Other features and advantages of the disclosure are apparent from the following description, and from the claims.

Basics of Digital-to-Analog Converters

A DAC is a device that produces a quantized (discrete step) analog output in response to a binary digital input code. The digital input signal may be e.g. input from transistor logic (TTL), emitter-coupled logic (ECL), complementary metal-oxide-semiconductor (CMOS) circuits, low-voltage differential signaling (LVDS), a high-speed interface such as e.g. JESD204, while the analog output signal may be either a voltage or a current. To generate the output, a reference quantity (either a voltage or a current) is divided into binary and/or linear fractions. The digital input then drives switches to individual DAC units, which could comprise current sources, voltage sources, resistors, capacitors, etc., that combine an appropriate number of these fractions to produce the output, a process sometimes referred to as "encoding." The number and size of the fractions, as well as the type of encoding used, reflect the number of possible digital input codes, which is a function of converter resolution or the number of bits (N) in the digital input code. For example, N bits could result in $2^N$ possible codes.

As used herein, the term "DAC unit," sometimes also referred to as a "DAC cell," refers to an analog element such as a current source or a switched capacitor element that delivers an analog quantity such as charge or current. For example, in context of a current-steering DAC, a DAC unit may comprise a DAC element that includes two current sources, e.g. a p-type metal-oxide-semiconductor (P-MOS) and an n-type metal-oxide-semiconductor (N-MOS) current sources, as well as switching mechanisms associated with each of the two current sources. In another example, a DAC unit is an element that can deliver a charge Q equal to the product of a pre-defined reference voltage Vref and a capacitance C. The polarity of this charge is defined by the digital input to the DAC unit.

Segmented DACs

Segmented architectures, where the full resolution of a converter is spread across two or more sub-DACs, can be used for both current- and voltage-output DACs. FIG. 1 illustrates an exemplary segmented DAC system 100 according to some embodiments of the disclosure. The DAC system 100 may receive an N-bit digital input 102 and convert the received digital input into an analog output 104. The forward slash sign ("/") shown over the data path 102 in FIG. 1, as well as over some other data paths shown in the present FIGUREs, is used to indicate, as is typically used in the art, that data is provided in parallel (i.e. such a data path is a signal bus as opposed to a single signal). For example, for the data path 102, this sign indicates that data representing each N-bit digital data value may be provided in parallel, with portions of the complete data provided over the different paths.

In some embodiments, the DAC system 100 may be viewed as comprising a digital domain 106 and an analog domain 108. Digital controller 110, segmentation 112, and coding functions, e.g. thermal coding 114 and binary coding 116, may be and usually are implemented in the digital domain 106, while an analog bias block 118, DAC thermal units 120, DAC binary units 122, and an output adder 124 may be implemented in the analog domain 108.

The digital controller 110 may be configured to generate control signals which control an operation mode of the DAC system (e.g. control power on and off, sample rate, output range, filter bandwidth, etc.), a range of the analog output signal 104, and so on.

The segmentation unit 112 may be configured to separate each of the N-bit values of the digital input signal 102 into their M-bit most significant bit (MSB) values (where M is an integer equal to or greater than zero and equal to or less than N), shown in FIG. 1 as MSB 113, and (N−M)-bit least significant bit (LSB) values, shown in FIG. 1 as LSB 115. The MSB and the LSB values are then provided to their respective coding elements 114 and 116.

In the exemplary illustration of FIG. 1, the coding element for the MSB is shown as a thermal coding element 114, while the coding element for the LSB is shown as a binary coding element 116. In such implementation, the thermal coding element 114 will encode the M-bit MSB signal 113 into $2^M$-bit thermal code which, in turn, switches the individual DAC thermal units (T-units) 120 on and off to convert M-bit MSB parts of the input values of the digital signal 102 to analog values. The binary coding element 116 will encode the (N−M)-bit LSB signal 115 into (N−M)-bit binary code which, in turn, switches the individual DAC binary units (B-units) 122 on and off to convert (N−M)-bit LSB parts of the input values of the digital signal 102 to analog values. All of the $2^M$ DAC thermal units 120 in the analog domain 108 are the same. The N−M DAC binary units 122 are binary scaled according to their control bits. Both DAC thermal units 120 and DAC binary units 122 will generate analog voltage or current according to the reference voltage or current provided by the analog bias block 118. The analog summer 124 will then add the outputs from all the DAC units to generate the final analog output 104, which can be analog voltage or analog current.

Segmented DACs enable finding a balance between accuracy and design complexity of a converter. One benefit of segmentation is that it allows reducing the number of DAC units required to achieve a given resolution (e.g. N bits), thus allowing smaller die sizes. Therefore, it is common for high-resolution DACs to be segmented. Dummy signal generation methods described herein may be used in, but are not limited to being used in, segmented DACs.

Figure 2A:
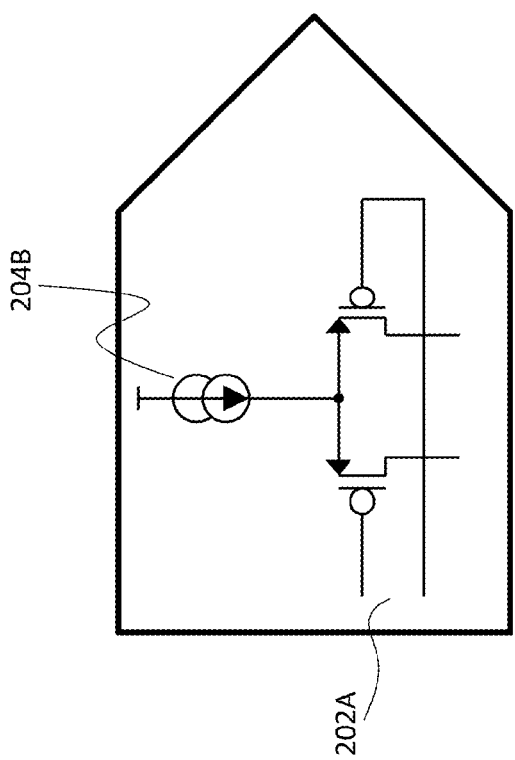
FIGS. 2A and 2B provide schematic illustrations of DAC units using, respectively, P-MOS switches and N-MOS current sources.
Figure 2B:
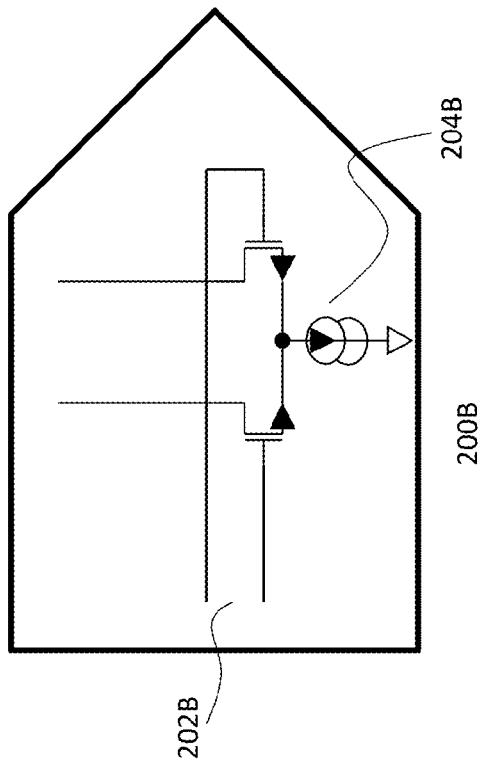

There are many different methods to convert digital input values to analog voltage or current values, switch current being one of the most popular methods for high-speed high-resolution DACs. FIGS. 2A and 2B provide schematic illustrations for DAC units 200A and 200B using, respectively, P-MOS and N-MOS current sources, as known in the art. The DAC units 200A and 200B as shown to receive, respectively, digital input signals 202A and 202B. The digital input signals can be differential digital codes (as shown in the examples of FIGS. 2A and 2B) or single-ended digital codes, depending on the design specification. The DAc units 200A or 200B are configured to control the output of their respective current sources 204A or 204B to provide output current in a DAC system such as the DAC system 100. It is the currents from the current sources such as e.g. 204A or 204B that are added together by the adder 124 to generate DAC's final analog current output (similar functionality is implemented for the voltage output).

Each of the DAC thermal units 120 and DAC binary units 122 shown in FIG. 1 can be implemented as the DAC units 200A or 200B as shown in FIGS. 2A-2B. When implemented in one of the DAC thermal units 120, the current source units 204A or 204B would only depend on the DAC's segmentation scheme and DAC's full analog range. When implemented in one of the DAC binary units 122, the current source units 204A or 204B would depend not only on DAC's segmentation scheme and DAC's full analog range, but also would have a relationship to the particular binary bit being implemented in that the current values of the current source units 204A or 204B and device size of the DAC units 200A or 200B would be scaled according to the binary code.

Limitations on DAC Performance

Analog signals are continuous time-domain signals with infinite resolution and possibly infinite bandwidth. However, an analog output of a DAC is a signal constructed from discrete, quantized, values generated at uniform, but finite, sampling time intervals. In other words, an output of a DAC attempts to represent an analog signal with a signal that features finite resolution and finite bandwidth. Quantization and sampling impose fundamental and predictable limits on DAC's performance. Quantization determines the maximum dynamic range of a DAC and causes quantization error, or noise, in the output of a DAC. Sampling determines the maximum bandwidth of a DAC's output signal according to Nyquist criteria.

In addition, operation of a DAC may be affected by non-ideal effects beyond those dictated by quantization and sampling. One such effect is creation of data dependent noise where different DAC input data patterns will provide different data dependent interference to DAC's analog output through many different schemes. Such data dependent interference is treated as a noise with respect to the desired analog output signal.

In one example of the data dependent interference scheme, different digital data patterns inject different noise into power or ground of a DAC. This noise is then added to final DAC analog output through related DAC elements.

In another example of the data dependent interference scheme, different digital data patterns affect the quality of the clock signals used to sample or latch related data for synchronization proposes. This noise is also added to the final DAC analog output, e.g. through DAC thermal units 120 or DAC binary units 122 shown in FIG. 1.

Dummy Signal Generation to Address Data Dependent Noise Issues

Methods for addressing data dependent noise problems as described above exist in prior art. One such method involves generating an additional digital signal to complement, or balance, a digital data signal to be converted in that, at each clock cycle, there will be a data toggle either in the digital data signal or in the additional digital signal, where "data toggle" refers to the change in the digital input values from 0 to 1 or from 1 to 0. Providing both of such signals to a DAC unit results in a DAC unit converting a uniform pattern comprising alternating 1's and 0's. The output of the DAC unit resulting from the conversion of the bits of the additional digital signal is not used in any way, resulting in a name "dummy signal" being given to such an additional digital signal. Such an approach is described e.g. in U.S. Pat. No. 6,344,816 explaining adding an additional clocked circuit called a "dummy latch" in parallel with the main DAC circuit called an "output latch." The output of the dummy latch is not itself used in any way, rather the dummy latch and the output latch are connected and operated such that with every cycle of the clocking signal, one of the latches will change state and the other will not. Thus, if the output latch changes state with the data signal, the dummy latch maintains its logic state, and if the output latch maintains its logic state constant with an unchanging data signal, then the dummy latch will change logic states. According to the '816 patent, this arrangement maintains a constant loading on the clocking signal that is independent of the data signal logic state, thereby reducing or eliminating data dependent noise in DAC's output.

Figure 3:
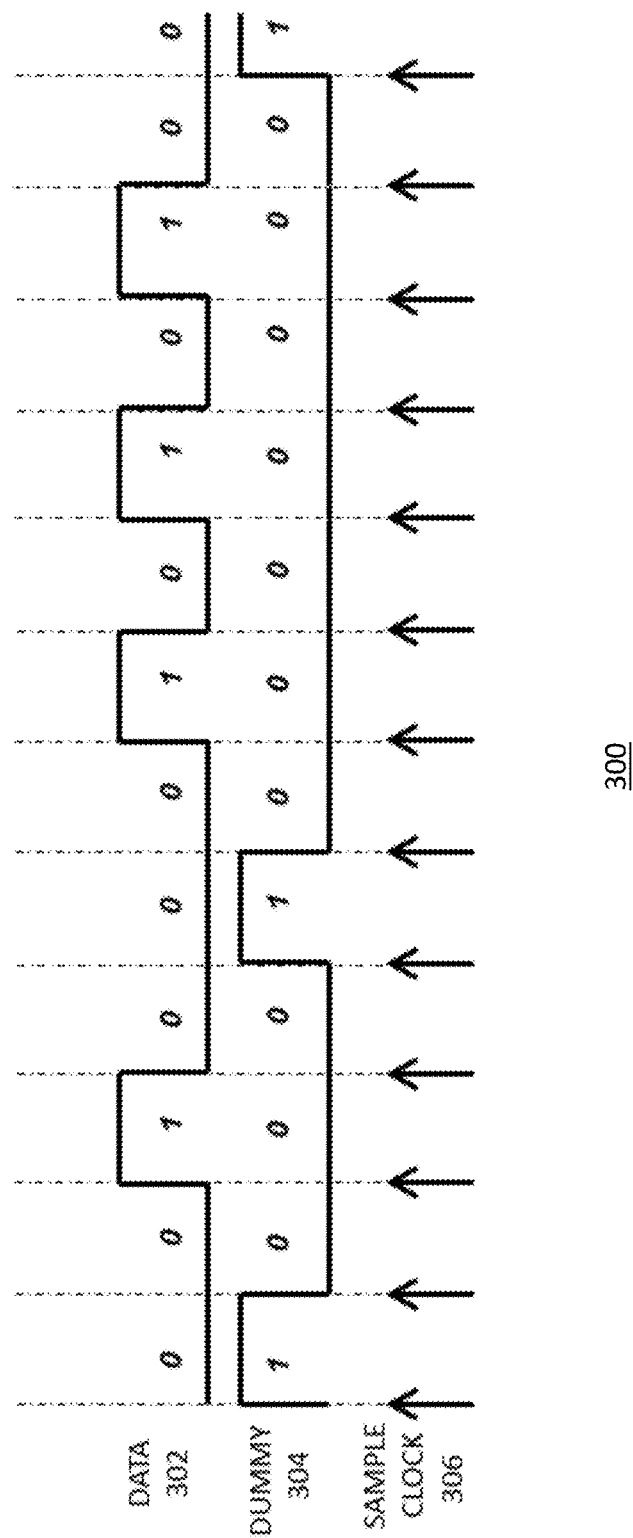
FIG. 3 provides a schematic illustration of an exemplary timing diagram for a data signal and a dummy signal used to reduce data dependent noise.

FIG. 3 illustrates an exemplary timing diagram 300 for a data signal 302 and a dummy signal 304 used to reduce data dependent noise in the manner described above. As shown in FIG. 3, the dummy signal 304 is such that, at each sample clock edge (shown with a sample clock 306), there is a data toggle in one and only one of either the data signal 302 or the dummy signal 304. When two such signals are provided to a DAC unit, e.g. either DAC thermal unit or DAC binary unit as shown in FIG. 1, then, for any data pattern, the DAC unit will act as converting a clock pattern from digital to analog and the DAC output data dependent noise will be removed or reduced accordingly.

Existing Dummy Signal Generation Approaches

Figure 4:
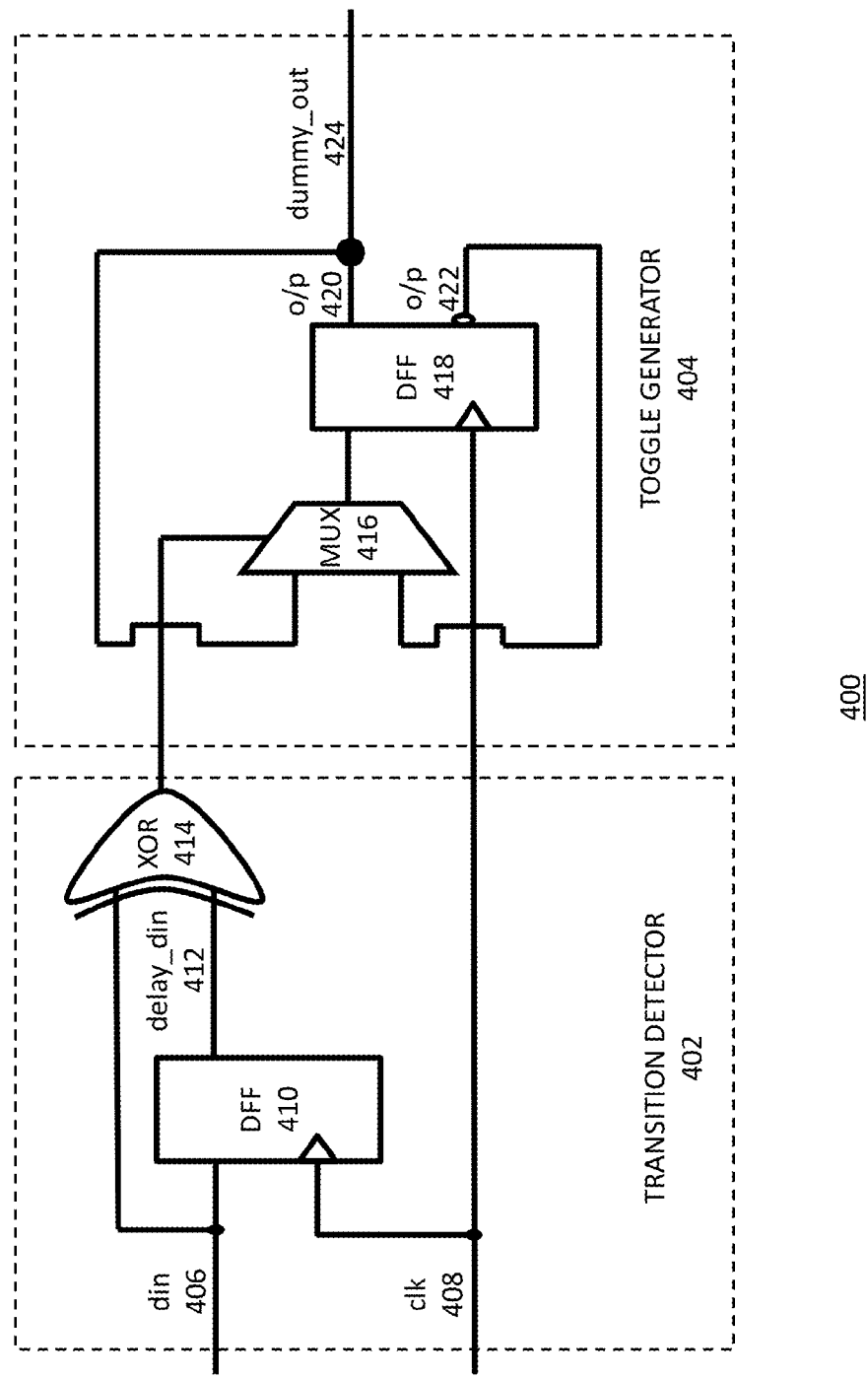
FIG. 4 provides a schematic illustration of a circuit for implementing a conventional dummy signal generation approach for data dependent noise reduction in a DAC.

FIG. 4 illustrates a circuit 400 for implementing a conventional dummy generation approach for data dependent noise reduction in a DAC, according to prior art. The conventional dummy generation approach is based on using a transition detector 402 and a toggle generator 404. The transition detector 402 is configured to delay the digital input, shown in FIG. 4 as "din" 406, by one clock period of a clock signal, shown as "clk" 408, using a D flip flop (DFF) 410. Then the delay version of the data signal, shown as "delay_din" 412, and the original data signal 406 are compared by an XOR gate 414 to determine whether there is a data toggle in the input data signal 406. The toggle generator 404 includes a multiplexer 416 and a DFF 418. The DFF 418 has one output that is non-inverting, shown in FIG. 4 as an output 420, and one output that is inverting, shown as an output 422. The multiplexer 416 is configured to select inverting output or non-inverting output of the DFF 418 based on the decision from the transition detector 402, and the DFF 418 will sample the output of the multiplexer 416 to generate the dummy data output "dummy_out" 424. With this scheme, if there is no transition in the input data "din"

406 detected by the transition detector 402 (i.e. there is no data toggle in the data signal), the toggle generator 404 will select the inverting output 422 of the DFF 418 through the multiplexer 416 to generate a data toggle in the dummy data (i.e. there is data toggle in the dummy signal). On the other hand, if there is a transition in the input data "din" 406 detected by the transition detector 402 (i.e. there is data toggle in the data signal), then the toggle generator 404 will select the non-inverting output 420 of the DFF 418 through the multiplexer 416 to keep dummy data value to be the same as in the previous clock sample edge (i.e. no data toggle in the dummy signal).

As DAC's sample rates increase to Giga-Samples per Second (GSPS), the conventional dummy generation method for data dependent noise reduction of a DAC, shown in FIG. 4, encounters substantial implementation problems due to the smaller sample period and data synchronization requirements. A careful analysis of the circuit shown in FIG. 4 reveals that there are two critical timing paths in the conventional dummy data generation method: one critical timing path includes the path from the transition detector 402 to the input of the DFF 418, and the other one includes the feedback paths inside the toggle generator 404. One feedback path inside the toggle generator 404 is from the inverting output 422 of the DFF 418 to the input of the DFF 418 through the multiplexer 416, and the other feedback path is from the non-inverting output 420 to the input of the DFF 418 through the multiplexer 416. If the DAC's sample rate is, for example, 10 GSPS, then the sample clock period is 100 picoseconds, in which case the delay from the transition detector 402 to the input of the DFF 416 and the delay in the feedback paths inside the toggle generator 404 must be less than 100 ps, which is very difficult to achieve without including complex structures, increasing die area, and/or increasing power consumption. For example, the first critical timing path issue can be addressed by adding additional retime stages to release timing requirement by the pipeline processing or by implementing the transition detector 402 in low-speed clock domain. Both of these approaches to reducing delay will burn more power or/and cost more die area. As far as the second critical timing path issue, all of the conventional dummy data generation methods include the feedback logic operation and the second critical timing paths as described above. Unlike the first critical timing path issue, the second feedback paths timing requirement can't be improved on by pipeline processing. The only solution there is to burn more power to reduce the delay and hope to meet the tight feedback timing requirements with careful implementation, but there are still some potential risks in such implementations due e.g. to the process (P), power supply voltage (V), and temperature (T) variations (together sometimes referred to as "PVT" variations). PVT variations refer to differences between different circuits' elements that result in time differences, i.e. phase shifts, between signals traversing paths containing those elements. In real-world systems, PVT variations often present themselves to thwart synchronization attempts in the individual components, and cannot be neglected when the timing margins are tight.

The problems described above are exacerbated by the fact that, typically, an individual dummy generator is used for each DAC unit employed. If a DAC is implemented as a segmented DAC where thermal and binary DAC units are used, there will always be many data paths for both thermal codes and binary codes and each of them needs an individual dummy data generator for data dependent noise reduction. For example, a 16-bit DAC with 5-11 segmentation scheme (i.e. the first 5 of 16 bits of the digital input to be converted are MSB and the last 11 bits are LSB) would use at least 43 DAC units ($2^5$ thermal units and 11 binary units, $2^5+11=43$) and, therefore, would need at least 43 dummy generators. In another example, a 16-bit DAC with 6-10 segmentation scheme would use as many as at least 74 DAC units ($2^6$ thermal units and 10 binary units, $2^6+10=74$) and, therefore, would need at least 74 dummy generators. Considering the large numbers of dummy generators that need to be used in a DAC and considering the tight timing requirements that have to be satisfied for high-speed operation, additional costs in terms of power consumption and die area associated with conventional dummy generation methods are often unacceptable.

Proposed Dummy Signal Generation Approaches

Improved mechanisms for generating dummy signals are proposed herein. Embodiments of the present disclosure are based on an insight that a dummy signal can be generated without having to determine whether there is a transition in the consecutive bit values of data bits provided to a DAC unit, which inevitably requires examination of two consecutive data bits at a time, and without involving feedback paths as was done in the prior art methods. In particular, the inventor of the present disclosure realized, and proved theoretically, that it is possible to generate a dummy signal by merely keeping track of whether each bit of a time-series of data bits provided to a particular DAC unit is an even bit or an odd bit, and either including the bit as it is or including an inverted version of the bit as a dummy bit corresponding to the data bit. Thus, a dummy signal can be generated on a bit-by-bit basis by examining each data bit to determine whether the bit is even or odd and to determine the bit value (i.e. 0 or 1) of the data bit, and, based on the result of the examination of the data bit, setting a dummy bit that corresponds to the examined data bit. Examination of two consecutive data bits at the same time is no longer necessary as the decision on the value of a dummy bit can be made based only on the results of examination of a corresponding data bit. As used herein, expressions such as "a dummy bit corresponding to a data bit" or "a dummy bit being provided in synchronization with a data bit" are used to describe a dummy bit that is sent to a DAC unit at the same time with that data bit for the purposes of reducing or eliminating data dependent noise, as known in the art. This may be illustrated by considering an exemplary time-series of data bits that may be provided to a DAC unit.

Figure 5:
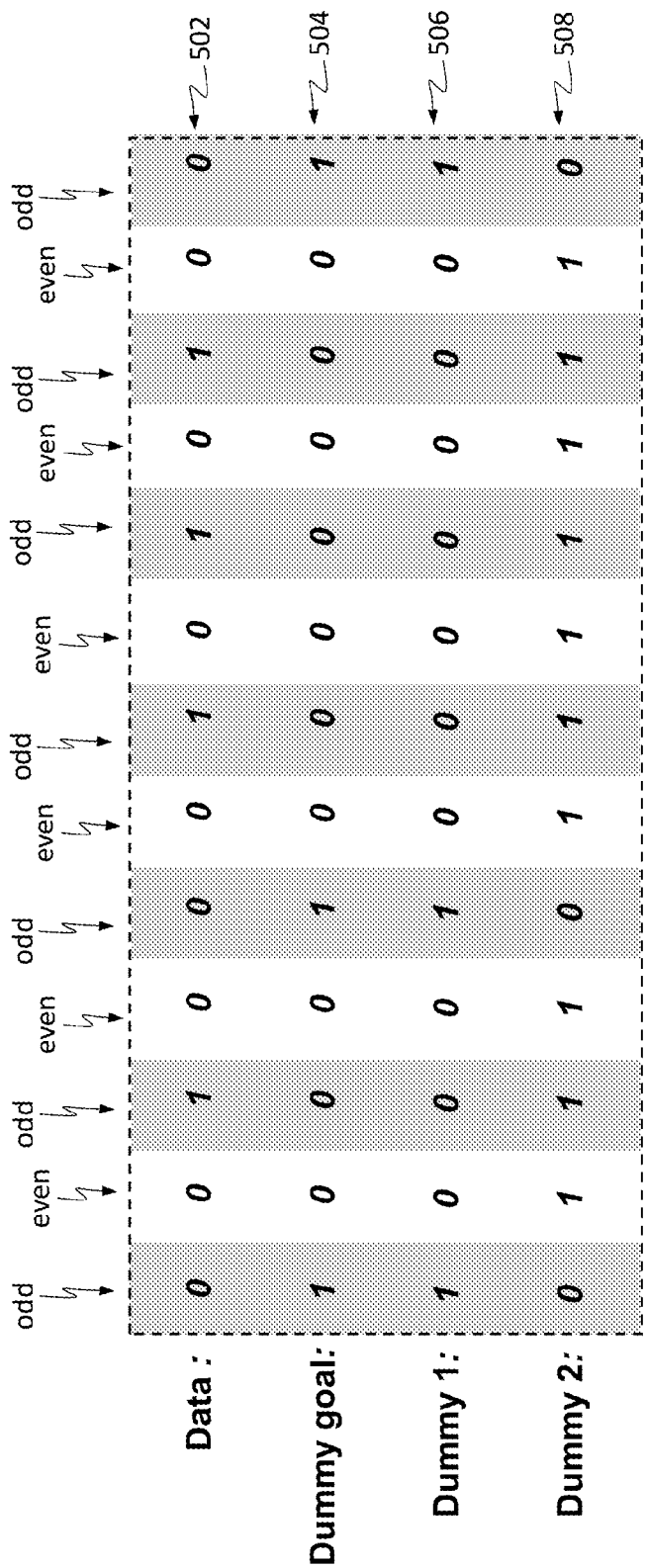
FIG. 5 illustrates examples of a data signal and two corresponding dummy signals for data dependent noise reduction in a DAC generated according to different embodiments of the disclosure.

Consider, for example, that a time-series of data bits that may be provided to a DAC unit includes a series of bits 0, 0, 1, . . . as shown with data 502 illustrated in FIG. 5. This is the same example of a time-series of data bit as was illustrated as data 302 in FIG. 3. A time-series of dummy bits corresponding to the time-series of such data bits was also illustrated in FIG. 3, as dummy 304, and is repeated in FIG. 5 as a dummy goal 504, the "goal" indicating that this time-series of dummy bits provided in synchronization with the data bits 502 result in a situation that at each clock cycle (i.e. each time there is a new data bit and a new corresponding dummy bit) there is a data toggle in either the data bits or the dummy bits.

Returning back to FIG. 5, a time-series 506, indicated as dummy 1, illustrates a dummy signal that may be generated according to one embodiment proposed herein. In that embodiment, a dummy signal is generated by including, in a dummy signal, an inverted version of each odd bit of the time-series of data bits, and by including each even bit of the time-series of data bits as is (i.e. not inverted). FIG. 5 includes shading overlaid over the time-series of bits in order to clearly show corresponding data and dummy bits (i.e. those are the bits in each column—either shaded or non-shaded) and to show odd and even bits of the time-series (in FIG. 5, odd bits are shaded). For example, in the exemplary illustration of FIG. 5, the first bit of the data 502 is 0. Since, in this embodiment, all odd bits are inverted, a dummy bit corresponding to this first data bit is 1 (i.e. result of the inversion of the bit value of 0). The next bit of the data 502 is also 0. Since, in this embodiment, all even bits are left as-is, a dummy bit corresponding to this second data bit is 0 as well. The third bit of the data 502 is 1. Since, again, all odd bits are inverted, the third dummy bit corresponding to this third data bit is 0 (i.e. result of the inversion of the data bit value of 1). The fourth bit of the data 502 is 0. Since, again, all even bits are left as-is, the fourth dummy bit is also 0. Such bit-by-bit comparison may be extended for the remainder of the data bits shown in FIG. 5 to realize that the resulting time-series of dummy bits, dummy 1, is exactly the same as the dummy goal 504. In fact, generating a dummy signal in this manner for any data signal would result in a time-series of dummy bits such that, at each clock cycle, there is a data toggle in one and only one of the data bits or the dummy bits.

Again returning back to FIG. 5, a time-series 508, indicated as dummy 2, illustrates a dummy signal that may be generated according to another embodiment proposed herein. This embodiment may be viewed as the reverse of the previous embodiment in that a dummy signal is generated by including, in a dummy signal, each odd bit of the time-series of data bits as is (i.e. not inverted) and by including an inverted version of each even bit of the time-series of data bits. For example, in the exemplary illustration of FIG. 5, the first bit of the data 502 is 0. Since, in this embodiment, all odd bits are non-inverted, a dummy bit corresponding to this first data bit is also 0. The next bit of the data 502 is 0 again. Since, in this embodiment, all even bits are inverted, a dummy bit corresponding to this second data bit is 1 (i.e. result of the inversion of the bit value of 0). The third bit of the data 502 is 1. Since, again, all odd bits are included as they are, the third dummy bit corresponding to this third data bit is 1. The fourth bit of the data 502 is 0. Since, again, all even bits are inverted, the fourth dummy bit is 1 (i.e. result of the inversion of the bit value of 0). Such bit-by-bit comparison may be extended for the remainder of the data bits shown in FIG. 5 to realize that the resulting time-series of dummy bits, dummy 2, also results in having a data toggle in one and only one of the data bits 502 or the dummy bits 508 at each clock cycle.

Figure 6:
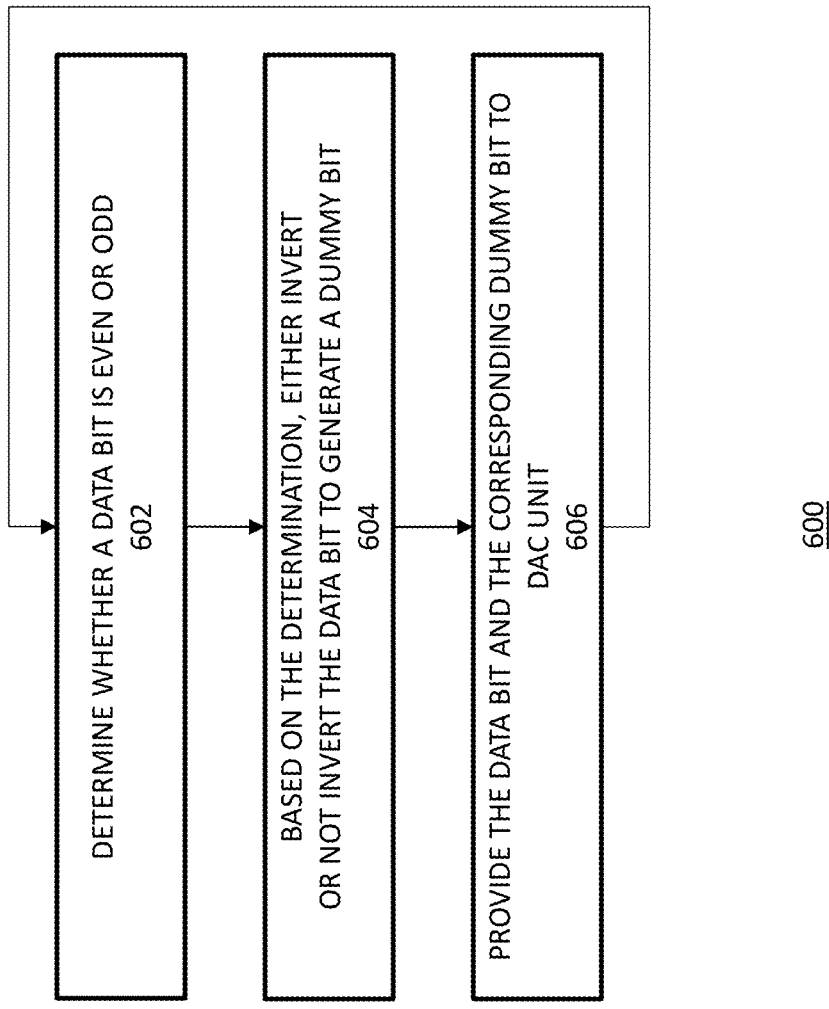
FIG. 6 illustrates a dummy signal generation method for data dependent noise reduction in a DAC, according to some embodiments of the disclosure.

Accordingly, a dummy signal generation method for data dependent noise reduction in a DAC in accordance with various embodiments of the present disclosure may be summarized as a method 600 shown in FIG. 6. The method 600 includes determining whether a particular data bit is even or odd (box 602). Based on the determination, a bit that is either an inverted or a not inverted version of this data bit is included as a corresponding dummy bit in the time-series of dummy bits (box 604). Namely, according to the first embodiment described above, where odd bits are inverted and even bits are non-inverted, if the data bit is determined in box 602 to be an odd bit, then the corresponding dummy bit generated in box 604 has a value that is inverted with respect to the value of the data bit analyzed in box 602, and otherwise (i.e. if the data bit is determined in box 602 to be an even bit) the corresponding dummy bit has the same value as the data bit. On the other hand, according to the second embodiment described above, where even bits are inverted and odd bits are non-inverted, if the data bit is determined in box 602 to be an odd bit, then the corresponding dummy bit generated in box 604 has the same value as the data bit analyzed in box 602, and otherwise (i.e. if the data bit is determined in box 602 to be an even bit) the corresponding dummy bit has a value that is inverted with respect to the value of the data bit analyzed in box 602. Both the data bit and the dummy bit corresponding to it are then provided to the DAC unit (box 606 in FIG. 6). How exactly these bits are provided to the DAC unit (i.e. box 606 itself) and how these bits are used to reduce or eliminate data dependent noise in a DAC may be done as known in the art and therefore not described here. For example, dummy signals may be used to reduce or eliminate data dependent noise as described in the '816 patent mentioned above. However, in various embodiments, the dummy signal generation mechanisms as proposed herein may be used in combination with any other techniques for reducing or eliminating data dependent noise using dummy signals.

Proposed mechanisms for generating dummy signals allow removing the two critical timing paths described above from dummy signal generation, generating the dummy bits with simple logic operation. As a result, dummy signals for use in reducing or eliminating data dependent noise in DAC may be generated in a manner that minimizes power consumption and die area necessary to generate the dummy signals and alleviates at least some of the tight timing margins that a design has to satisfy. One or more of these effects become especially pronounced for high-speed DACs and/or for segmented DACs.

Figure 7:
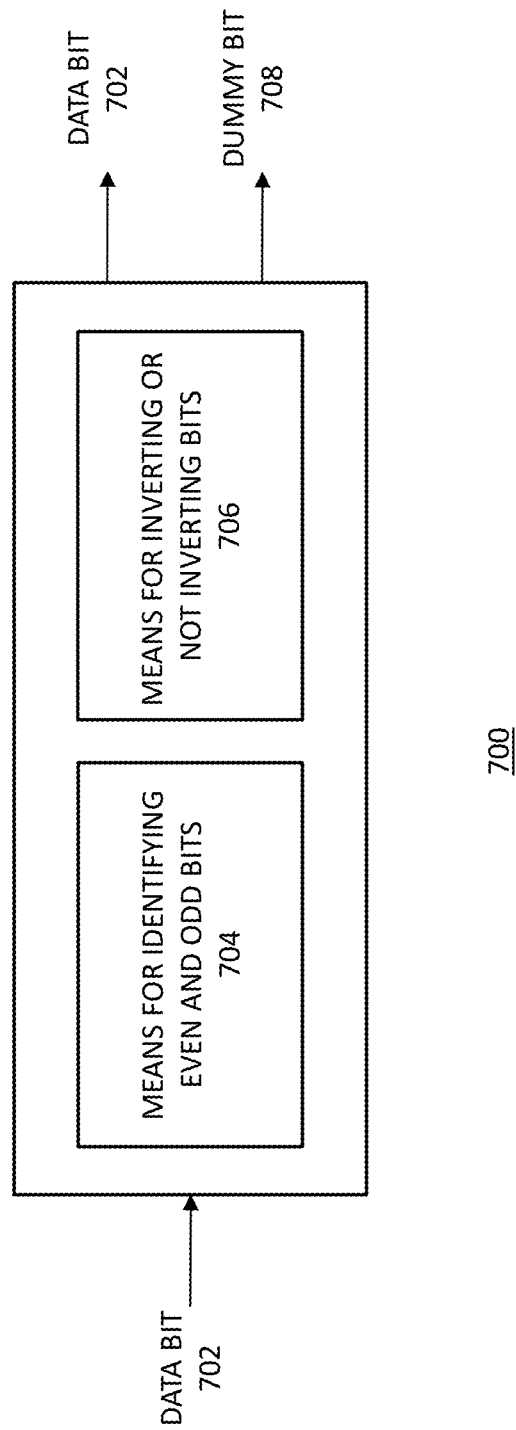
FIG. 7 provides a schematic illustration of a dummy signal generator, according to some embodiments of the disclosure.

FIG. 7 provides a schematic illustration of a dummy signal generator 700, according to some embodiments of the disclosure. As shown in FIG. 7, a dummy signal generator 700 may receive a sequence of data bits 702 (i.e. a time-series of data bits), e.g. from an encoder, such as e.g. a thermal coding element or a binary coding element described herein. The dummy signal generator 700 may include an arrangement 704 for identifying whether each incoming bit is an even bit or an odd bit, starting from a certain reference point (i.e. starting from a certain point that allows classifying bits as odd or even). The dummy signal generator 700 may include an arrangement 706 for generating a dummy signal by inverting or non-inverting the data bits 702 in accordance with the determination made by the arrangement 704, e.g. as described with reference to method 600. To that end, in some embodiments, the dummy signal generator 700 may include at least a processor and a memory, not shown in FIG. 7, configured to implement various improved techniques for dummy signal generation described herein. The dummy signal generator 700 may then output both the data bits 702 and the dummy bits 704 corresponding to the data bits 702, e.g. to an entity that is responsible for data dependent noise reduction. In some embodiments, the data bits 702 may be provided to such entity without the involvement of the dummy signal generator 700 (i.e. the generator 700 does not have to re-produce the data bits 702 at its output).

A dummy signal generator such as the one shown in FIG. 7 may be used for each DAC unit of a plurality of DAC units typically included in a DAC. For example, such a dummy signal generator may be included in association with each DAC unit used in a segmented DAC, as shown in FIG. 8.

Figure 8:
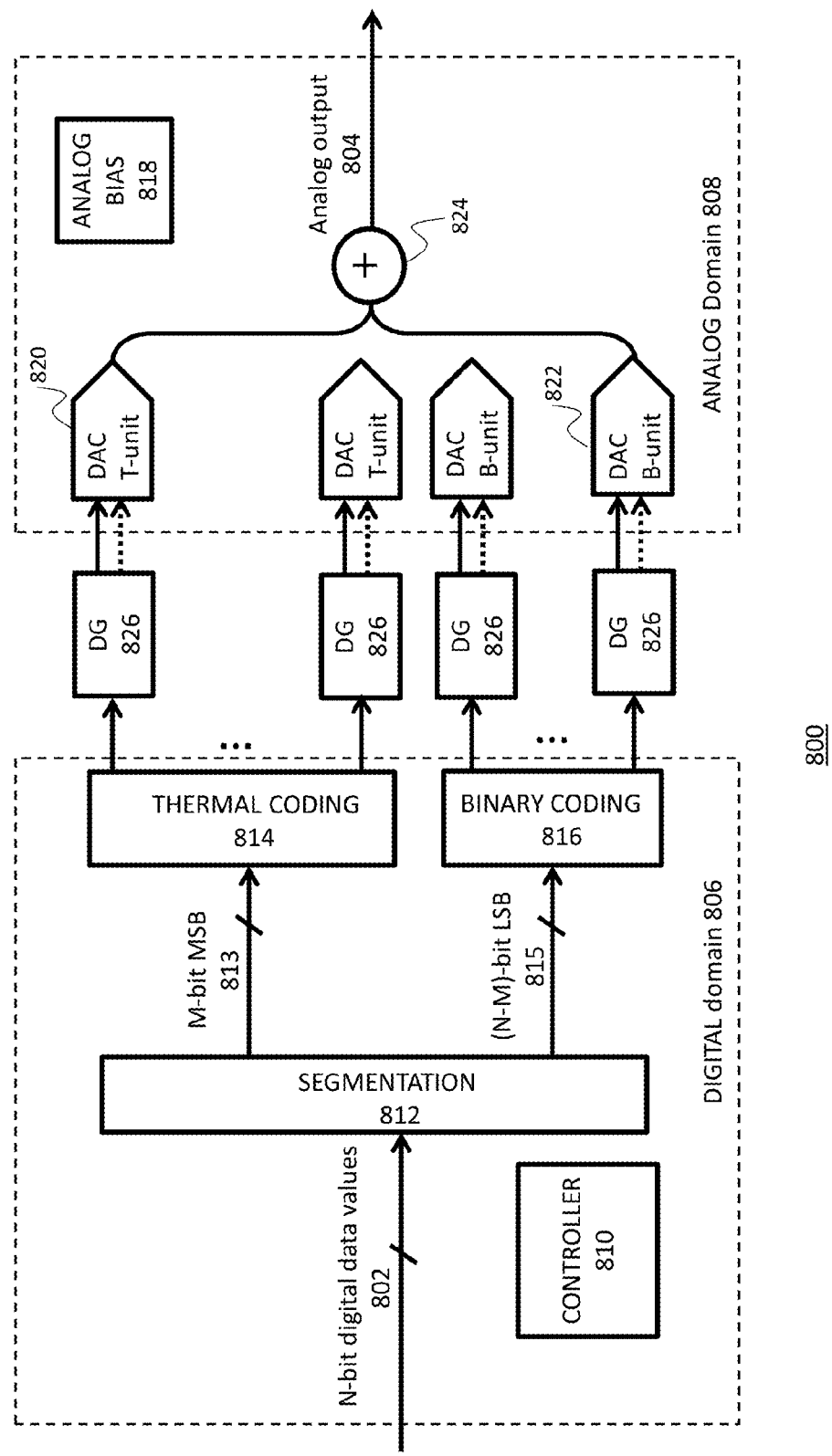
FIG. 8 provides a schematic illustration of an exemplary segmented DAC system with dummy generation, according to some embodiments of the disclosure.

FIG. 8 provides a schematic illustration of an exemplary segmented DAC system 800 that is similar to the DAC system 100 shown in FIG. 1. Elements in FIG. 8 identified by reference numerals similar to those of FIG. 1 are intended to indicate that the elements are analogous (e.g. 802 is analogous to 102, 804 is analogous to 104, 806 is analogous to 106, etc.). In the interests of brevity, description of these elements is not repeated. Unlike the system shown in FIG. 1, the DAC system 800 further includes dummy signal generators, shown as DG 826, associated with each of the DAC units 820 and 822.

Each of the DG 826 may be implemented as the dummy signal generator 700 shown in FIG. 7 and may be configured to carry out the method 600 shown in FIG. 6. In various embodiments, the DG 826, as well as the dummy signal generator 700 in any other setting (e.g. not in a segmented DAC) may be implemented either in analog or in digital domains. In still other embodiments, the DG 826, as well as the dummy signal generator 700 in any other setting may be implemented partially in an analog domain and partially in a digital domain. Therefore, the DG 826 is illustrated in FIG. 8 as not belonging to either of these domains.

With reference to FIG. 8, the M-bit MSB signal 813 will be encoded into $2^M$-bit thermal code by the thermal coding element 814, and the (N−M)-bit LSB signal 815 will be encoded by the binary coding element 816. Each bit of the $2^M$-bit thermal code and (N−M)-bit binary code will be sent to the respective DG 826. In other words, for each N-bit digital data value 802 being converted, each of the $(2^M+N-M)$ bits generated by the coding elements 814 and 816 will be provided to its own dummy signal generator DG 826 to generate $(2^M+N-M)$ dummy bits in total for each digital input value. These dummy bits are then used to reduce or eliminate data dependent noise in the DAC's analog output 804.

A solid arrow shown in FIG. 8 between each DG 826 to a corresponding DAC unit is intended to illustrate that the DG 826 provides data bits to the DAC unit, while a dotted arrow shown in FIG. 8 between each DG 826 to a corresponding DAC unit is intended to illustrate that the DG 826 provides dummy bits to the DAC unit. Thus, for each N-bit digital data value 802 being converted, $2^M$ bits of thermal data is provided from the DGs 826 to the DAC T-units 820 (solid arrows), which, in turn, causes the individual DAC T-units 820 to be switched on and off to convert the M-bit MSB value of the digital data signal value 802 to an analog value. In addition, $2^M$ bits of thermal dummy data is also provided from the DGs 826 to the DAC T-units 820 (dotted arrows), which, in turn, drives the dummy switches in the DAC T-units 820 to be switched on and off to reduce the data dependent noise from power, ground or clock paths in the DAC unit, as known in the art. Similarly, for each N-bit digital data value 802 being converted, (N−M) bits of binary data is provided from the DGs 826 to the DAC B-units 822 (solid arrows), which, in turn, causes the individual DAC B-units 822 to be switched on and off to convert the (N−M)-bit LSB value of the digital data signal value 802 to an analog value. In addition, (N−M) bits of binary dummy data is also provided from the DGs 826 to the DAC B-units 822 (dotted arrows), which, in turn, drives the dummy switches in the DAC B-units 822 to be switched on and off to reduce the data dependent noise from power, ground or clock paths in the DAC unit, as known in the art.

In various embodiments, dummy signal generation methods as described herein may be implemented in different DAC architectures, with different DAC segmentation schemes, or in DACs that are not segmented.

In further embodiments, dummy signal generation according to any of the two embodiments described herein may be implemented in different clock domains, e.g. at half-rate, quarter-rate and other relatively low-speed clock domains, e.g. according to a particular DAC architecture being implemented. Implementing dummy signal generation as proposed herein at half-rate, quarter-rate and other low-speed clock domains provides an additional advantage in that such implementations naturally divide data bits into odd and even bits, i.e. additional arrangements for determining whether each data bit is an odd bit do not have to be included.

Figure 9A:
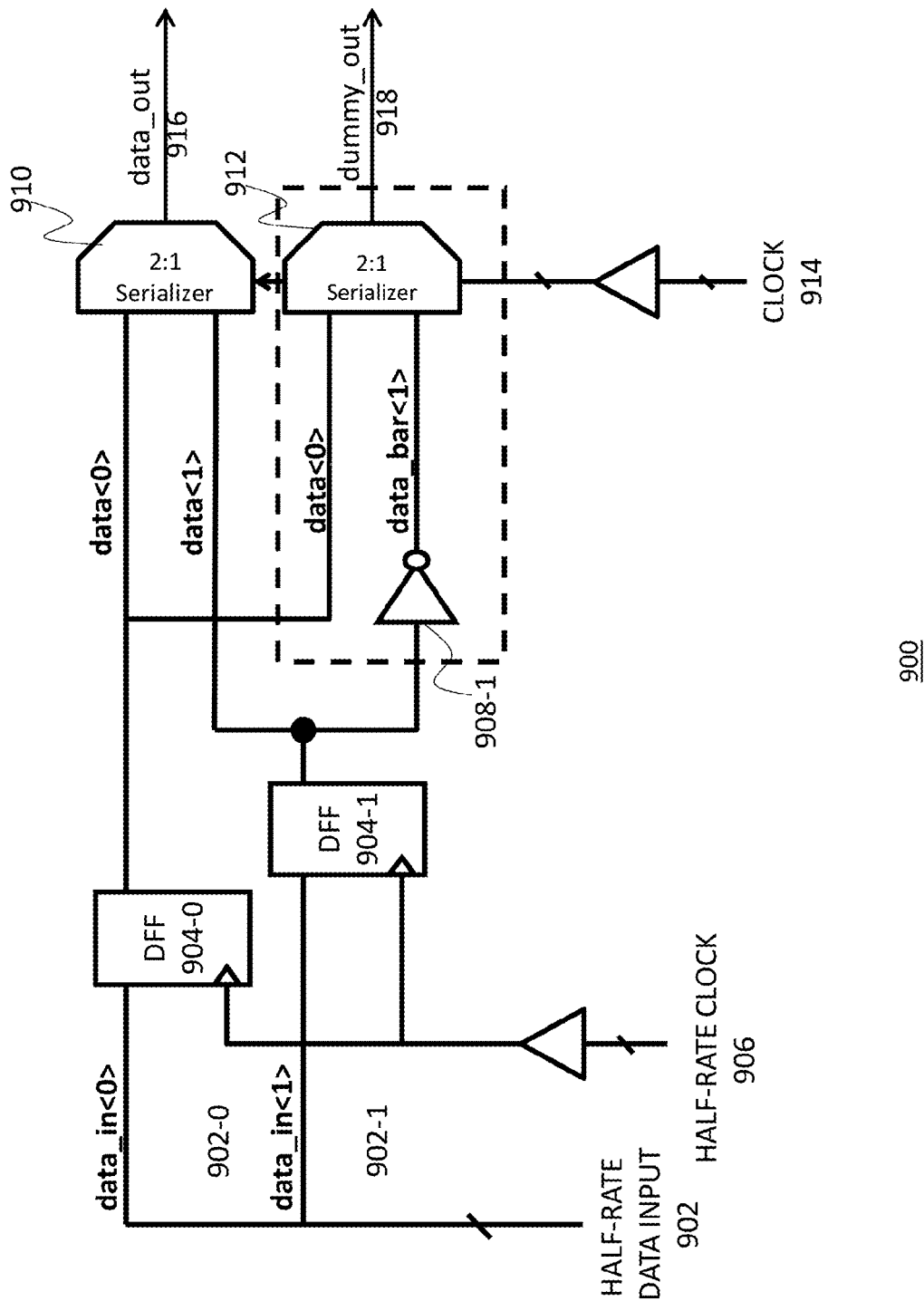
FIG. 9A provides a schematic illustration of an exemplary half-rate dummy signal generation circuit, according to some embodiments of the disclosure.

FIG. 9A provides a schematic illustration of an exemplary half-rate dummy signal generation circuit 900, according to some embodiments of the disclosure. The dummy signal generation circuit 900 can be any one of the DGs 826 of the segmented DAC system 800 shown in FIG. 8 or be the dummy signal generator 700 shown in FIG. 7. Path 902 in FIG. 9A indicates half-rate data input. The input data 902 is provided in parallel over two paths which are separated within the circuit 900, as shown in FIG. 9A with the input data 902 separating into two paths, 902-0 and 902-1, where one half of the data is provided over one path, shown as data_in<0>902-0, and the other half of the data is provided over another path, shown as data_in<1>902-1. Not only does providing data bits in this manner allow using half-rate clock, but it also naturally separates odd and even bits of the data signal. For example, data bits of the digital data signal to be converted may be separated so that each consecutive bit is provided over a different path, thus intrinsically separating odd and even bits of the data signal 902.

In some embodiments, after separation into 902-0 and 902-1, the parallel half-rate digital input 902 may be retimed (e.g. delayed by one clock cycle) by DFFs 904-0 and 904-1, respectively, at the sample edge of a half-rate clock 906, for synchronization. In other words, the half-rate digital input 902 may be sampled by the respective DFFs 904 with the half-rate clock 906, e.g. to reduce data skew and guarantee an improved timing margin. The retiming by the DFFs 904 is optional, i.e. in other embodiments, the circuit 900 does not have to include the DFFs 904, in which case the data data_in<0> and data_in<1> may be passed to serializers 910 and 912 without a delay.

In various embodiments, the half-rate clock 906 can be either a single-phase clock or a multi-phase clock. The parallel half-rate digital input 902, possibly retimed, may be serialized by a 2:1 serializer 910, using a clock signal 914, to generate a data output 916, shown in FIG. 9A as data_out. In various embodiments, the serializing clock 914 may be either a full-rate clock or a half-rate clock operating in double data rate (DDR) mode. At the same time, an inverter 908-1 included in the path of data_in<1> will generate an inverted bit, shown in FIG. 9A as data_bar<1>, from the data bit data_in<1> (which could be either the odd bit or the even bit, depending on the reference used for which bits are odd and which bits are even). The inverted bit data_bar<1> and the non-inverted bit "data<0>" will be serialized by a 2:1 serializer 912, also using the clock 914, to generate a dummy signal 918, shown in FIG. 9A as dummy_out. The dashed box in FIG. 9A illustrates elements responsible for the inversion of every other data bit.

Thus, as can be seen from FIG. 9A, because the serializer 910 receives data<0> and data<1> as inputs, i.e. the input data bit as provided in the half-rate data input 902 in parallel, it correctly forms full-rate data signal 916. This could be the data signal 302, 502, the data signal 702 provided out of the dummy signal generator 700, or the data signal shown with a solid black arrow from the DG 826 to any DAC unit. On the other hand, because the serializer 912 receives data<0> and data_bar<1> as inputs, i.e. every other bit of the input data 902 is inverted, it correctly forms a full-rate dummy signal 918. This could be the dummy signal 304, any of the dummy signals 504-508, the data signal 708 provided out of the dummy signal generator 700, or the dummy signal shown with a dotted black arrow from the DG 826 to any DAC unit.

Figure 9B:
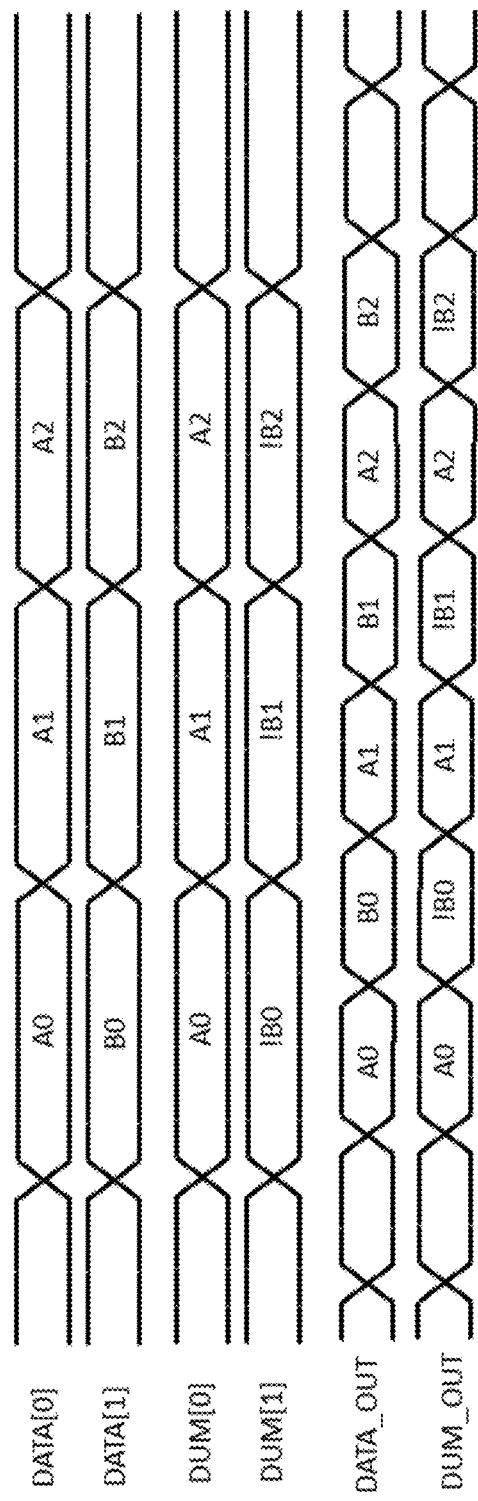
FIG. 9B provides a schematic illustration of an exemplary timing diagram for the half-rate dummy signal generation circuit of FIG. 9A, according to some embodiments of the disclosure.

FIG. 9B provides a schematic illustration of an exemplary timing diagram for the half-rate dummy signal generation circuit of FIG. 9A, according to some embodiments of the disclosure. FIG. 9B illustrates that the half-rate input data signal of one signal line of the signal bus 902, shown as data_in<0>902-0 in FIG. 9A and shown as DATA[0] in FIG. 9B, includes a time-series of bits A0, A1, A2, and so on. Similarly, the half-rate input data signal of the second signal line of the signal bus 902, shown as data_in<1>902-1 in FIG. 9A and shown as DATA[1] in FIG. 9B, includes a time-series of bits B0, B1, B2, and so on. Because the data bits of these two half-rate signal lines are to be combined, the actual data signal to be provided to a DAC unit comprises a time-series of bits A0, B0, A1, B1, A2, B2, and so on, as shown with DATA_OUT in FIG. 9B (this is the data_out 916 shown in FIG. 9A). FIG. 9B also illustrates that dummy data is generated by taking all of the bits provided over one half-rate signal line as they are and by inverting all of the bits provided over the second half-rate signal line. In the example of FIG. 9B this is shown with taking all of the bits provided over DATA[0] as they are, i.e. DUM[0] illustrates a sequence of the same bits as DATA[0], and with inverting all of the bits provided over DATA[1], i.e. DUM[1] illustrates a sequence of bits that includes all of the bits of DATA[1], but inverted (inverted bits are indicated with an exclamation sign before the bit reference—e.g. "!B0" means a bit value that is an inversion of the bit value B0). The serializer 910 then generates a full-rate data signal output DATA_OUT, as shown in FIG. 9B, by combining alternating bits from DATA[0] and DATA[1]. Similarly, the serializer 912 generates a full-rate dummy signal output DUM_OUT, as shown in FIG. 9B (this is the signal dummy_out 918 shown in FIG. 9A), by combining alternating bits from DUM[0] and DUM[1].

Figure 10A:
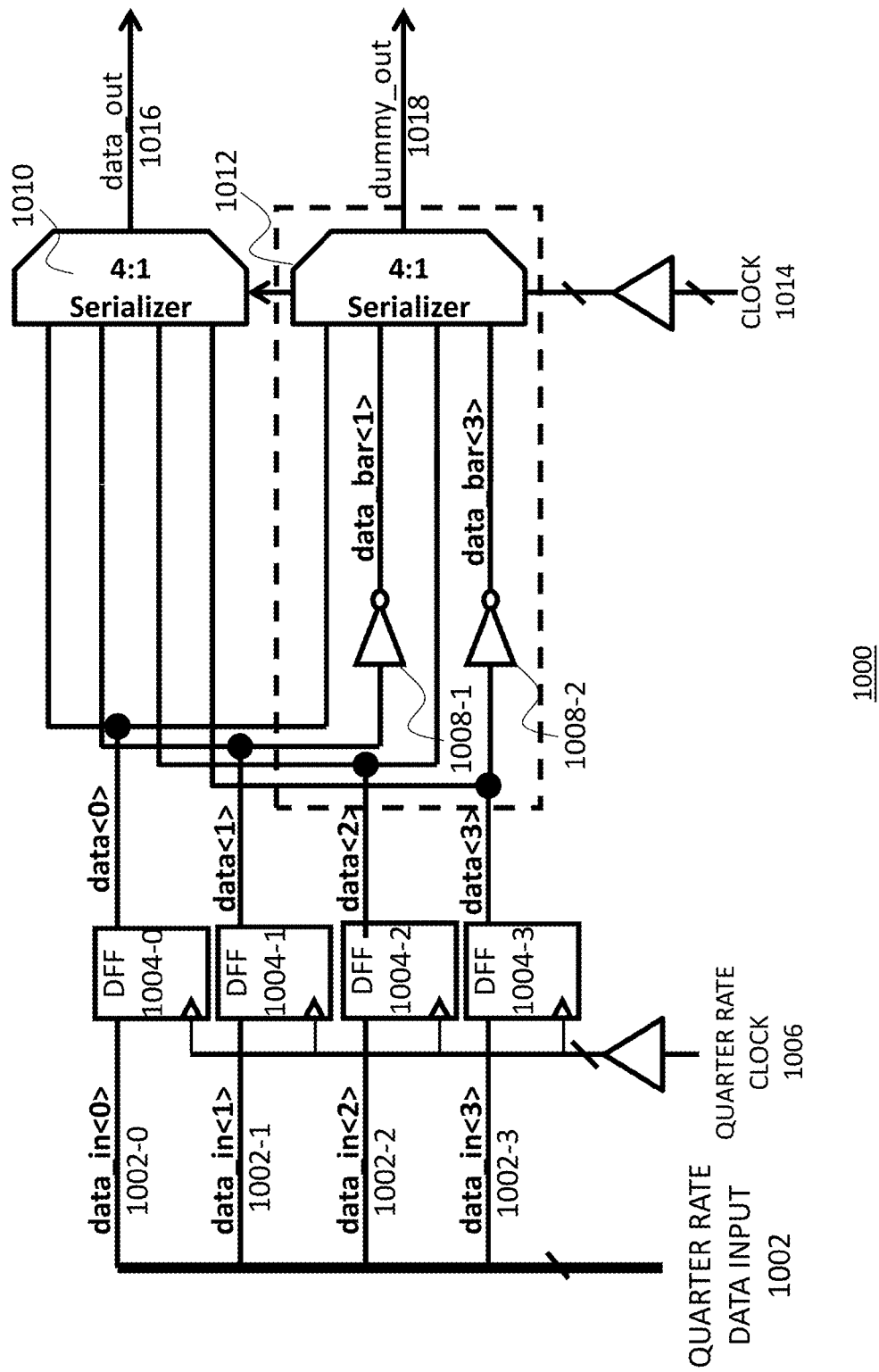
FIG. 10A provides a schematic illustration of an exemplary quarter-rate dummy signal generation circuit, according to some embodiments of the disclosure.

FIG. 10A provides a schematic illustration of an exemplary quarter-rate dummy signal generation circuit 1000, according to some embodiments of the disclosure. The dummy signal generation circuit 1000 can be any one of the DGs 826 of the segmented DAC system 800 shown in FIG. 8 or be the dummy signal generator 700 shown in FIG. 7. Path 1002 in FIG. 10A indicates quarter-rate data input. The input data 1002 is provided in parallel over four paths which are separated within the circuit 1000, as shown in FIG. 10A with the input data 1002 separating into four paths, 1002-0, 1002-1, 1002-2, and 1002-3, where one quarter of the data is provided over one path, shown as data_in<0>1002-0, another quarter of the data is provided over another path, shown as data_in<1>1002-1, a third quarter of the data is provided over another path, shown as data_in<2>1002-2, and the last quarter of the data is provided over another path, shown as data_in<3>1002-3. Not only does providing data bits in this manner allow using a quarter-rate clock, but, similar to the circuit 1000, it also naturally separates odd and even bits of the data signal. For example, data bits of the digital data signal to be converted may be separated so that each consecutive bit is provided over a different path, thus intrinsically separating odd and even bits of the data signal 1002 (e.g. all odd bits are provided over 1002-0 and 1002-2, while all even bits are provided over 1002-1 and 1002-3, or vice versa, or in any other combination).

After separation into 1002-0 through 1002-3, the parallel quarter-rate digital input 1002 may be retimed (i.e. delayed by one clock cycle) by respective DFFs 1004, at the sample edge of the quarter-rate clock 1006, for synchronization, similar to FIG. 9A. Also similar to FIG. 9A, this retiming stage is optional.

In various embodiments, the quarter-rate clock 1006 can be either a single-phase clock or a multi-phase clock. The parallel quarter-rate digital input 1002, possibly retimed, may be serialized by a 4:1 serializer 1010, using a clock signal 1014, to generate a data output 1016, shown in FIG. 10A as data_out. In various embodiments, the serializing clock 1014 may be a full-rate clock, a half-rate clock operating in double data rate (DDR) mode, or multiple phase quarter-rate clocks. A person of ordinary skill in the art would recognize various possible implementations of serializers, including clocks used therein, all of which are within the scope of the present disclosure.

At the same time, an inverter 1008-1 will generate an inverted bit, shown in FIG. 10A as data_bar<1>, from the data bit data_in<1> (which could be either the odd bit or the even bit, depending on the reference used for which bits are odd and which bits are even). Similarly, an inverter 1008-3 will generate an inverted bit, shown in FIG. 10A as data_bar<3>, from the data bit data_in<3>. The inverted bit data_bar<1> and data_in<3>, and the non-inverted bit data<0> and data<2> will be serialized by a 4:1 serializer 1012, also using the clock 1014, to generate a dummy signal 1018, shown in FIG. 10A as dummy_out. The dashed box in FIG. 10A illustrates elements responsible for the inversion of every other data bit. In other embodiments, paths in which inverters 1008 are implemented may be different than those shown in the example of FIG. 10A, as long as the inverters are implemented in the paths where every other data bit is provided.

Thus, as can be seen from FIG. 10A, because the serializer 1010 receives data<0>, data<1>, data<2>, and data<3> as inputs, i.e. the input data bit as provided in the quarter-rate data input 1002 in parallel, it correctly forms full-rate data signal 1016. This could be the data signal 302, 502, the data signal 702 provided out of the dummy signal generator 700, or the data signal shown with a solid black arrow from the DG 826 to any DAC unit. On the other hand, because the serializer 1012 receives data<0>, data_bar<1>, data<2>, and data_bar<3> as inputs, i.e. every other bit of the input data 1002 is inverted, it correctly forms a full-rate dummy signal 1018. This could be the dummy signal 304, any of the dummy signals 504-508, the data signal 708 provided out of the dummy signal generator 700, or the dummy signal shown with a dotted black arrow from the DG 826 to any DAC unit.

Figure 10B:
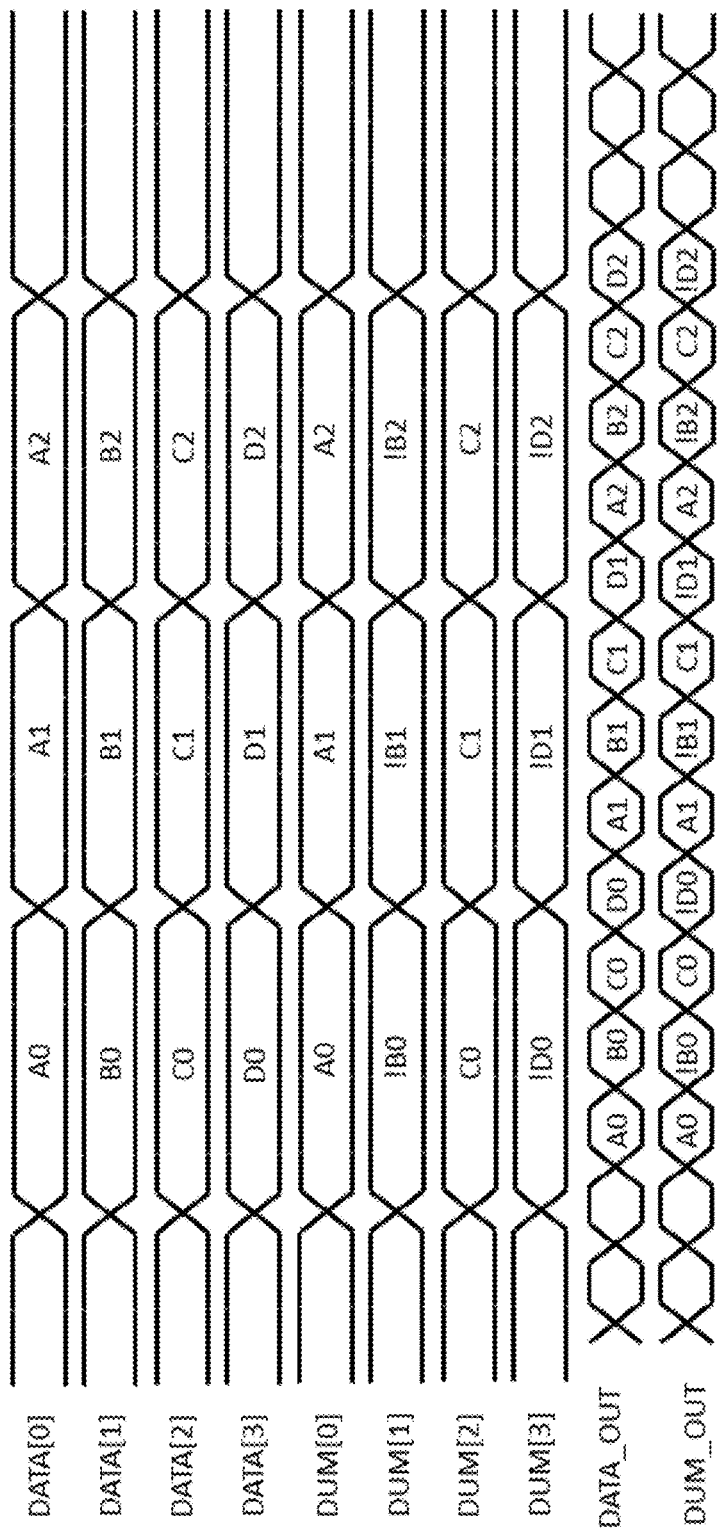
FIG. 10B provides a schematic illustration of an exemplary timing diagram for the quarter-rate dummy signal generation circuit of FIG. 10A, according to some embodiments of the disclosure.

FIG. 10B provides a schematic illustration of an exemplary timing diagram for the quarter-rate dummy signal generation circuit of FIG. 10A, according to some embodiments of the disclosure. FIG. 10B illustrates that the quarter-rate input data signal of a first signal line of the signal bus 1002, shown as data_in<0>1002-0 in FIG. 10A and shown as DATA[0] in FIG. 10B, includes a time-series of bits A0, A1, A2, and so on. Similarly, the quarter-rate input data signal of a second signal line of the signal bus 1002, shown as data_in<1> 1002-1 in FIG. 10A and shown as DATA[1] in FIG. 10B, includes a time-series of bits B0, B1, B2, and so on. The quarter-rate input data signal of a third signal line of the signal bus 1002, shown as data_in<2>1002-2 in FIG. 10A and shown as DATA[2] in FIG. 10B, includes a time-series of bits C0, C1, C2, and so on. Finally, the quarter-rate input data signal of a fourth signal line of the signal bus 1002, shown as data_in<3>1002-3 in FIG. 10A and shown as DATA[3] in FIG. 10B, includes a time-series of bits D0, D1, D2, and so on. Because the data bits of these four quarter-rate signal lines are to be combined, the actual data signal to be provided to a DAC unit comprises a time-series of bits A0, B0, C0, D0, A1, B1, C1, D1, A2, B2, C2, D2, and so on, as shown with DATA_OUT in FIG. 10B (this is the data_out 1016 shown in FIG. 10A). FIG. 10B also illustrates that dummy data is generated by taking all of the bits provided over every other quarter-rate signal line as they are and by inverting all of the bits provided over the remaining quarter-rate signal lines. In the example of FIG. 10B this is shown with taking all of the bits provided over DATA[0] and over DATA[2] as they are, i.e. DUM[0] illustrates a sequence of the same bits as DATA[0] and DUM[2] illustrates a sequence of the same bits as DATA[2], and with inverting all of the bits provided over DATA[1] and DATA[3], i.e. DUM[1] illustrates a sequence of bits that includes all of the bits of DATA[1], but inverted and DUM[3] illustrates a sequence of bits that includes all of the bits of DATA[3], but inverted. The serializer 1010 then generates a full-rate data signal output DATA_OUT, as shown in FIG. 10B, by combining bits from DATA[0]-DATA[3] as shown in FIG. 10B. Similarly, the serializer 1012 generates a full-rate dummy signal output DUM_OUT, as shown in FIG. 10B (this is the signal dummy_out 1018 shown in FIG. 10A), by combining alternating bits from DUM[0]-DUM[3].

In other embodiments, besides half-rate and quarter-rate as shown in FIGS. 9 and 10, respectively, other low-rate clock domains could be used in a similar manner as that described above, such as e.g. ⅙-rate, ⅛-rate, 1/10-rate, and so on. Any 1/(2n)-rate clock domain can be used because it intrinsically separates bits into odd and even bits, simplifying the implementation of the teachings of the present disclosure. All of these low-rate clock domain implementations are, therefore, within the scope of the present disclosure.

Figure 11A:
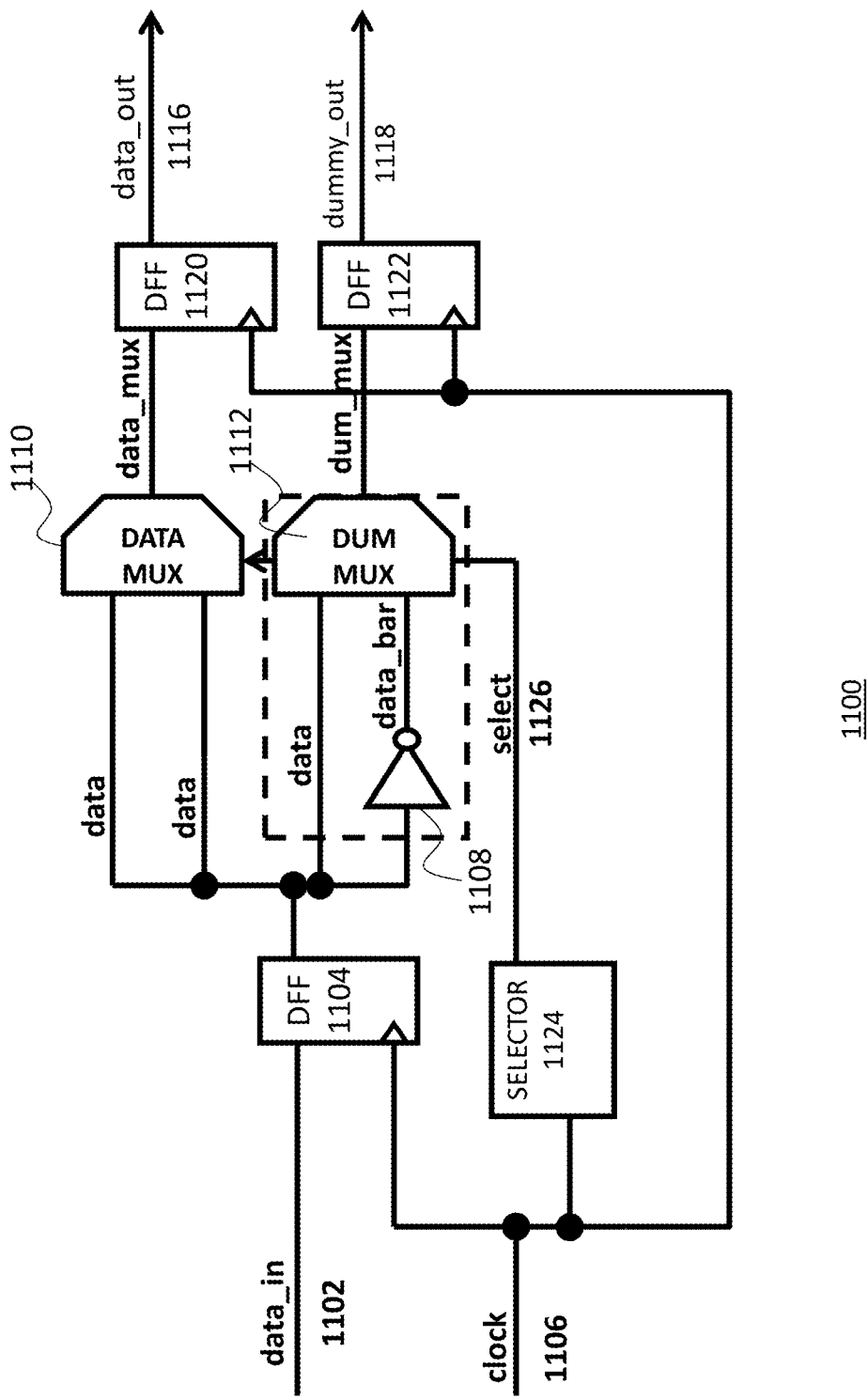
FIG. 11A provides a schematic illustration of an exemplary full-rate dummy signal generation circuit, according to some embodiments of the disclosure.

FIG. 11A provides a schematic illustration of an exemplary full-rate dummy signal generation circuit 1100, according to some embodiments of the disclosure. The dummy signal generation circuit 1100 can be any one of the DGs 826 of the segmented DAC system 800 shown in FIG. 8 or be the dummy signal generator 700 shown in FIG. 7.

As shown in FIG. 11A, the full-rate digital input 1102 may be retimed by a DFF 1104 at the sample edge of clock 1106 for synchronization. Functionality of the DFF 1104 is similar to the DFFs 904 and 1004 shown in FIGS. 9A and 10A, and therefore the descriptions related to this functionality is not repeated here. Similar to FIGS. 9A and 10A, retiming by the DFF 1104 is optional for different embodiments of the present disclosure.

As shown in FIG. 11A, the full-rate digital data, possibly retimed by the DFF 1104, will be sent to a 2:1 multiplexer 1110 that will combine the data to generate a data signal output 1116 "data_out". At the same time, full-rate digital input "data" and inverted full-rate digital input "data_bar", inverted by an inverter 1108, are sent to a 2:1 multiplexer 1112 to generate a dummy signal output 1118 "dummy_out".

In an embodiment shown in FIG. 11A, DFFs 1120 and 1122 may be used to retime the data generated by the multiplexer 1110 and dummy data generated by the multiplexer 1112, which could help reducing possible data skew across all the dummy generators. This retiming is optional, i.e. in other embodiments the circuit 1100 could be implemented without the DFFs 1120 and 1122 and without providing the clock 1106 to these elements. On the other hand, although not shown in FIGS. 9A and 10A, DFFs similar to the DFFs 1120 and 1122 could be used in the circuits 900 and 1000 as well, in order to retime output data signals and dummy signals generated by the respective serializers.

Furthermore, a selector 1124 is configured to act as a selection signal generator, to generate a select signal 1126 to control the dummy 2:1 multiplexer 1112. The select signal 1126 may be used to control the multiplexer 1112 to select inverting or non-inverting data provided as input thereto for odd bits and even bits, accordingly. For example, by being connected to the clock 1106, the selector 1124 may be configured to alternate select signal 1126 between indicating inverted and non-inverted input on consecutive clock cycles, i.e. first clock cycle—select inverted bit, second clock cycle—select non-inverted bit, third clock cycle—select inverted bit, fourth clock cycle—select non-inverted bit, and so on.

Figure 11B:
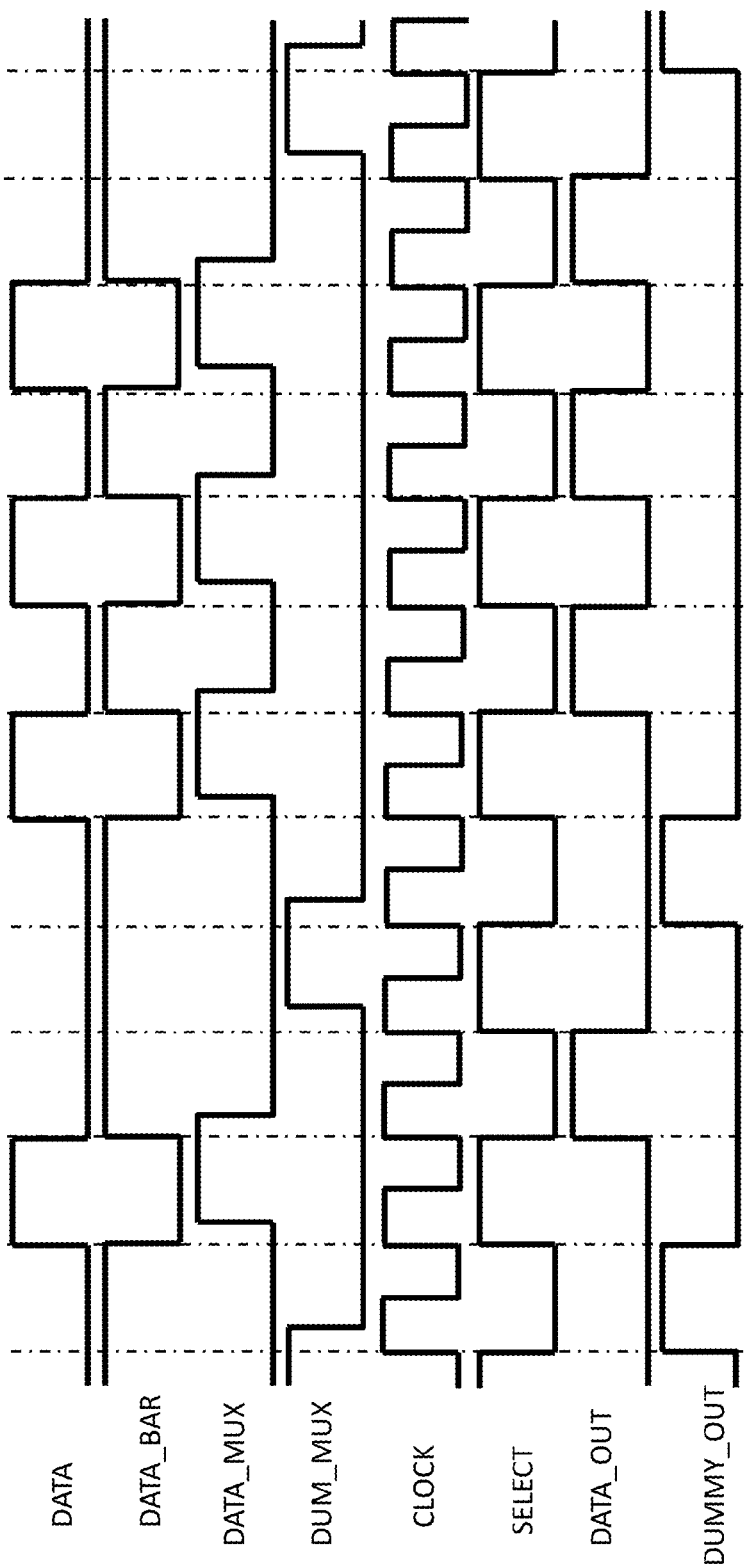
FIG. 11B provides a schematic illustration of an exemplary timing diagram for the full-rate dummy signal generation circuit of FIG. 11B, according to some embodiments of the disclosure.

FIG. 11B provides a schematic illustration of an exemplary timing diagram for the full-rate dummy signal generation circuit of FIG. 11B, according to some embodiments of the disclosure. The timing diagram of FIG. 11B provides a self-explanatory illustration consistent with explanations of FIG. 11A provided above.

SELECTED EXAMPLES

Example 1 provides a system for assisting in reducing data dependent noise in a digital-to-analog converter (DAC) unit of a DAC including a plurality of DAC units. The system includes means for determining, for each bit of a time-series of data bits to be provided to the DAC unit, the time-series of data bits including an alternating sequence of odd and even bits, whether the data bit is an odd bit or an even bit in the alternating sequence of odd and even bits; and means for generating a time-series of dummy bits to be used for data dependent noise reduction in the DAC unit by, for each data bit, generating a dummy bit corresponding to the data bit, as a bit having the same value as the data bit if the data bit is determined to be the even bit and as a bit having a value inverted from that of the data bit if the data bit is determined to be the odd bit.

Example 2 provides the system according to Example 1, where determining whether the data bit is an odd bit or an even bit includes separating the time-series of data bits into a first and a second half-rate time-series of data bits so that all odd data bits are included into the first half-rate time-series of data bits and all even data bits are included into the second half-rate time-series of data bits.

Example 3 provides the system according to Example 2, where generating the time-series of dummy bits includes generating a first and a second half-rate time-series of dummy bits, where each dummy bit of the first half-rate time-series of dummy bits includes a bit value that is an inversion of a corresponding data bit in the first half-rate time-series of data bits and each dummy bit of the second half-rate time-series of dummy bits includes a bit value of a corresponding data bit in the second half-rate time-series of data bits.

Example 4 provides the system according to Example 3, where generating the time-series of dummy bits further includes serializing the first and the second half-rate time-series of dummy bits into the time-series of dummy bits clocked at a full-rate clock.

Example 5 provides the system according to any one of Examples 2-4, further including a serializer for serializing the first and the second half-rate time-series of data bits into the time-series of data bits clocked at a full-rate clock.

Example 6 provides the system according to Example 1, where determining whether the data bit is an odd bit or an even bit includes separating the time-series of data bits into a first, a second, a third, and a fourth quarter-rate time-series of data bits so that every second odd data bit is included into the third quarter-rate time-series of data bits and all remaining odd data bits are included into the first quarter-rate time series of data bits, and so that every second even data bit is included into the fourth quarter-rate time-series of data bits and all remaining even data bits are included into the second quarter-rate time series of data bits.

Example 7 provides the system according to Example 6, where generating the time-series of dummy bits includes generating a first, a second, a third, and a fourth quarter-rate time-series of dummy bits, where each dummy bit of the first quarter-rate time-series of dummy bits includes a bit value that is an inversion of a corresponding data bit in the first quarter-rate time-series of data bits, each dummy bit of the second quarter-rate time-series of dummy bits includes a bit value of a corresponding data bit in the second quarter-rate time-series of data bits, each dummy bit of the third quarter-rate time-series of dummy bits includes a bit value that is an inversion of a corresponding data bit in the third quarter-rate time-series of data bits, and each dummy bit of the fourth quarter-rate time-series of dummy bits includes a bit value of a corresponding data bit in the fourth quarter-rate time-series of data bits.

Example 8 provides the system according to Example 7, where generating the time-series of dummy bits further includes serializing the first, the second, the third, and the fourth quarter-rate time-series of dummy bits into the time-series of dummy bits clocked at a full-rate clock.

Example 9 provides the system according to any one of Examples 6-8, further including a serializer for serializing the first, the second, the third, and the fourth quarter-rate time-series of data bits into the time-series of data bits clocked at a full-rate clock.

Example 10 provides the system according to any one of the preceding Examples, where the means for generating a time-series of dummy bits includes using an inverter to invert the data bit if the data bit is determined to be the odd bit.

Example 11 provides a system for assisting in reducing data dependent noise in a digital-to-analog converter (DAC) unit of a DAC including a plurality of DAC units. The system includes means for determining, for each bit of a time-series of data bits to be provided to the DAC unit, the time-series of data bits including an alternating sequence of odd and even bits, whether the data bit is an odd bit or an even bit in the alternating sequence of odd and even bits; and means for generating a time-series of dummy bits to be used for data dependent noise reduction in the DAC unit by, for each data bit, generating a dummy bit corresponding to the data bit, as a bit having the same value as the data bit if the data bit is determined to be the odd bit and as a bit having a value inverted from that of the data bit if the data bit is determined to be the even bit.

Example 12 provides the system according to Example 11, where determining whether the data bit is an odd bit or an even bit includes separating the time-series of data bits into a first and a second half-rate time-series of data bits so that all even data bits are included into the first half-rate time-series of data bits and all odd data bits are included into the second half-rate time-series of data bits.

Example 13 provides the system according to Example 12, where generating the time-series of dummy bits includes generating a first and a second half-rate time-series of dummy bits, where each dummy bit of the first half-rate time-series of dummy bits includes a bit value that is an inversion of a corresponding data bit in the first half-rate time-series of data bits and each dummy bit of the second half-rate time-series of dummy bits includes a bit value of a corresponding data bit in the second half-rate time-series of data bits.

Example 14 provides the system according to Example 13, where generating the time-series of dummy bits further includes serializing the first and the second half-rate time-series of dummy bits into the time-series of dummy bits clocked at a full-rate clock.

Example 15 provides the system according to any one of Examples 12-14, further including a serializer for serializing the first and the second half-rate time-series of data bits into the time-series of data bits clocked at a full-rate clock.

Example 16 provides the system according to Example 11, where determining whether the data bit is an odd bit or an even bit includes separating the time-series of data bits into a first, a second, a third, and a fourth quarter-rate time-series of data bits so that every second even data bit is included into the third quarter-rate time-series of data bits and all remaining even data bits are included into the first quarter-rate time series of data bits, and so that every second odd data bit is included into the fourth quarter-rate time-series of data bits and all remaining odd data bits are included into the second quarter-rate time series of data bits.

Example 17 provides the system according to Example 16, where generating the time-series of dummy bits includes generating a first, a second, a third, and a fourth quarter-rate time-series of dummy bits, where each dummy bit of the first quarter-rate time-series of dummy bits includes a bit value that is an inversion of a corresponding data bit in the first quarter-rate time-series of data bits, each dummy bit of the second quarter-rate time-series of dummy bits includes a bit value of a corresponding data bit in the second quarter-rate time-series of data bits, each dummy bit of the third quarter-rate time-series of dummy bits includes a bit value that is an inversion of a corresponding data bit in the third quarter-rate time-series of data bits, and each dummy bit of the fourth quarter-rate time-series of dummy bits includes a bit value of a corresponding data bit in the fourth quarter-rate time-series of data bits.

Example 18 provides the system according to Example 17, where generating the time-series of dummy bits further includes serializing the first, the second, the third, and the fourth quarter-rate time-series of dummy bits into the time-series of dummy bits clocked at a full-rate clock.

Example 19 provides the system according to any one of Examples 16-18, further including a serializer for serializing the first, the second, the third, and the fourth quarter-rate time-series of data bits into the time-series of data bits clocked at a full-rate clock.

Example 20 provides the system according to any one of Examples 11-19, where the means for generating a time-series of dummy bits includes using an inverter to invert the data bit if the data bit is determined to be the even bit.

Example 21 provides the system according to any one of the preceding Examples, where determining whether the data bit is an odd bit or an even bit includes using a control signal indicating whether the data bit is an odd bit or an even bit.

Example 22 provides the system according to Example 21, where the control signal is configured to switch indications of an odd bit and an even bit at each clock cycle.

Example 23 provides the system according to any one of the preceding Examples, where the DAC unit includes a current-steering DAC unit.

Example 24 provides the system according to any one of the preceding Examples, further including means for providing the time-series of data bits and the time-series of dummy bits to the DAC unit.

Example 25 provides the system according to Example 24, where provision of the time-series of data bits to the DAC unit is synchronized with provision of the time-series of dummy bits to the DAC unit.

Example 26 provides a system for reducing data dependent noise in a digital-to-analog converter (DAC), the DAC including a plurality of DAC units. The system includes a first dummy signal generator configured to receive a first data signal including a first time-series of data bits to be provided to a first DAC unit of the plurality of DAC units, use an inverter to invert every other bit of the first time-series of data bits, provide a first dummy signal as the first data signal with every other bit of the first time-series of data bits replaced with an inverted version of the bit, where the system is configured to provide the first dummy signal and the first data signal to the first DAC unit.

Example 27 provides the system according to Example 26, further including a second dummy signal generator configured to receive a second data signal including a second time-series of data bits to be provided to a second DAC unit of the plurality of DAC units, use an inverter to invert every other bit of the second time-series of data bits, and provide a second dummy signal as the second data signal with every other bit of the second time-series of data bits replaced with an inverted version of the bit, where the system is configured to provide the second dummy signal and the second data signal to the first DAC unit.

Example 28 provides the system according to Example 27, where the first DAC unit is a thermal DAC unit and the second DAC unit is a binary DAC unit.

Example 29 provides the system according to Example 26, where the first dummy signal generator configured to receive the first data signal over a data signal bus including two half-rate data signal inputs.

Example 30 provides the system according to Example 26, where the first dummy signal generator configured to receive the first data signal over a data signal bus including four quarter-rate data signal inputs.

Example 31 provides a method for assisting in reducing data dependent noise in a digital-to-analog converter (DAC) unit of a DAC including a plurality of DAC units. The method includes, for a time-series of data bits to be provided to the DAC unit and including an alternating sequence of odd and even bits, generating a time-series of dummy bits to be used for data dependent noise reduction by, for each data bit: determining whether the data bit is an odd bit or an even bit in the alternating sequence of odd and even bits, and either generating a dummy bit corresponding to the data bit, as a bit having the same value as the data bit if the data bit is determined to be the even bit and as a bit having a value inverted from that of the data bit if the data bit is determined to be the odd bit, or generating the dummy bit corresponding to the data bit as a bit having the same value as the data bit if the data bit is determined to be the odd bit and as a bit having a value inverted from that of the data bit if the data bit is determined to be the even bit.

Example 32 provides a non-transitory computer readable storage medium storing software code portions configured for, when executed on a processor, carrying out a method for assisting in reducing data dependent noise in a digital-to-analog converter (DAC) unit of a DAC including a plurality of DAC units, the method including, for a time-series of data bits to be provided to the DAC unit and including an alternating sequence of odd and even bits, generating a time-series of dummy bits to be used for data dependent noise reduction by, for each data bit, determining whether the data bit is an odd bit or an even bit in the alternating sequence of odd and even bits, and either generating a dummy bit corresponding to the data bit, as a bit having the same value as the data bit if the data bit is determined to be the even bit and as a bit having a value inverted from that of the data bit if the data bit is determined to be the odd bit, or generating the dummy bit corresponding to the data bit as a bit having the same value as the data bit if the data bit is determined to be the odd bit and as a bit having a value inverted from that of the data bit if the data bit is determined to be the even bit.

Example 33 provides a computer program product including software code portions configured for, when executed on a processor, carrying out a method for assisting in reducing data dependent noise in a digital-to-analog converter (DAC) unit of a DAC including a plurality of DAC units, the method including, for a time-series of data bits to be provided to the DAC unit and including an alternating sequence of odd and even bits, generating a time-series of dummy bits to be used for data dependent noise reduction by, for each data bit: determining whether the data bit is an odd bit or an even bit in the alternating sequence of odd and even bits, and either generating a dummy bit corresponding to the data bit, as a bit having the same value as the data bit if the data bit is determined to be the even bit and as a bit having a value inverted from that of the data bit if the data bit is determined to be the odd bit, or generating the dummy bit corresponding to the data bit as a bit having the same value as the data bit if the data bit is determined to be the odd bit and as a bit having a value inverted from that of the data bit if the data bit is determined to be the even bit.

Variations and Implementations

While embodiments of the present disclosure were described above with references to exemplary implementations as shown in FIGURES, a person skilled in the art will realize that the various teachings described above are applicable to a large variety of other implementations. For example, while some descriptions provided in the present disclosure refer to thermometer or binary coding, these descriptions are equally applicable to other coding methods used in DACs.

Embodiments of the present disclosure may be particularly advantageous for oversampling, or interpolating, DACs, such as e.g. sigma-delta DACs, because of their high speed. However, the techniques presented herein are not limited to oversampling DACs as they are equally applicable, possibly with modifications that would be apparent to a person of ordinary skill in the art, to other types of DACs, such as e.g. Nyquist DACs.

In certain contexts, the features discussed herein can be applicable to automotive systems, safety-critical industrial applications, medical systems, scientific instrumentation, wireless and wired communications, radar, industrial process control, audio and video equipment, current sensing, instrumentation (which can be highly precise), and other digital-processing-based systems.

Moreover, certain embodiments discussed above can be provisioned in digital signal processing technologies for medical imaging, patient monitoring, medical instrumentation, and home healthcare. This could include pulmonary monitors, accelerometers, heart rate monitors, pacemakers, etc. Other applications can involve automotive technologies for safety systems (e.g., stability control systems, driver assistance systems, braking systems, infotainment and interior applications of any kind).

In yet other example scenarios, the teachings of the present disclosure can be applicable in the industrial markets that include process control systems that help drive productivity, energy efficiency, and reliability. In consumer applications, the teachings of the dummy signal generation mechanisms discussed above can be used for image processing, auto focus, and image stabilization (e.g., for digital still cameras, camcorders, etc.). Other consumer applications can include audio and video processors for home theater systems, DVD recorders, and high-definition televisions.

In the discussions of the embodiments above, components of a system, such as e.g. clocks, multiplexers, buffers, and/or other components can readily be replaced, substituted, or otherwise modified in order to accommodate particular circuitry needs. Moreover, it should be noted that the use of complementary electronic devices, hardware, software, etc. offer an equally viable option for implementing the teachings of the present disclosure related to improved dummy signal generation techniques.

Parts of various systems for implementing improved dummy signal generation techniques as proposed herein can include electronic circuitry to perform the functions described herein. In some cases, one or more parts of the system can be provided by a processor specially configured for carrying out the functions described herein. For instance, the processor may include one or more application specific components, or may include programmable logic gates which are configured to carry out the functions describe herein. The circuitry can operate in analog domain, digital domain, or in a mixed signal domain. In some instances, the processor may be configured to carrying out the functions described herein by executing one or more instructions stored on a non-transitory computer readable storage medium.

In one example embodiment, any number of electrical circuits of FIGURES may be implemented on a board of an associated electronic device. The board can be a general circuit board that can hold various components of the internal electronic system of the electronic device and, further, provide connectors for other peripherals. More specifically, the board can provide the electrical connections by which the other components of the system can communicate electrically. Any suitable processors (inclusive of digital signal processors, microprocessors, supporting chipsets, etc.), computer-readable non-transitory memory elements, etc. can be suitably coupled to the board based on particular configuration needs, processing demands, computer designs, etc. Other components such as external storage, additional sensors, controllers for audio/video display, and peripheral devices may be attached to the board as plug-in cards, via cables, or integrated into the board itself. In various embodiments, the functionalities described herein may be implemented in emulation form as software or firmware running within one or more configurable (e.g., programmable) elements arranged in a structure that supports these functions. The software or firmware providing the emulation may be provided on non-transitory computer-readable storage medium comprising instructions to allow a processor to carry out those functionalities.

In another example embodiment, the electrical circuits of FIGURES may be implemented as stand-alone modules (e.g., a device with associated components and circuitry configured to perform a specific application or function) or implemented as plug-in modules into application specific hardware of electronic devices. Note that particular embodiments of the present disclosure implementing improved dummy signal generation techniques may be readily included in a system on chip (SOC) package, either in part, or in whole. An SOC represents an IC that integrates components of a computer or other electronic system into a single chip. It may contain digital, analog, mixed-signal, and often radio frequency functions: all of which may be provided on a single chip substrate. Other embodiments may include a multi-chip-module (MCM), with a plurality of separate ICs located within a single electronic package and configured to interact closely with each other through the electronic package. In various other embodiments, the functionalities of improved dummy signal generation techniques proposed herein may be implemented in one or more silicon cores in Application Specific Integrated Circuits (ASICs), Field Programmable Gate Arrays (FPGAs), and other semiconductor chips.

It is also imperative to note that all of the specifications, dimensions, and relationships outlined herein (e.g., the number of processors, logic operations, etc.) have only been offered for purposes of example and teaching only. Such information may be varied considerably without departing from the spirit of the present disclosure, or the scope of the appended claims. The specifications apply only to one non-limiting example and, accordingly, they should be construed as such. In the foregoing description, example embodiments have been described with reference to particular processor and/or component arrangements. Various modifications and changes may be made to such embodiments without departing from the scope of the appended claims. The description and drawings are, accordingly, to be regarded in an illustrative rather than in a restrictive sense.

Note that with the numerous examples provided herein, interaction may be described in terms of two, three, four, or more electrical components. However, this has been done for purposes of clarity and example only. It should be appreciated that the system can be consolidated in any suitable manner. Along similar design alternatives, any of the illustrated components, modules, and elements of FIGURES may be combined in various possible configurations, all of which are clearly within the broad scope of this Specification. In certain cases, it may be easier to describe one or more of the functionalities of a given set of flows by only referencing a limited number of electrical elements. It should be appreciated that the electrical circuits of FIGURES and its teachings are readily scalable and can accommodate a large number of components, as well as more complicated/sophisticated arrangements and configurations. Accordingly, the examples provided should not limit the scope or inhibit the broad teachings of the electrical circuits as potentially applied to a myriad of other architectures.

Note that in this Specification, references to various features (e.g., elements, structures, modules, components, steps, operations, characteristics, etc.) included in "one embodiment", "example embodiment", "an embodiment", "another embodiment", "some embodiments", "various embodiments", "other embodiments", "alternative embodiment", and the like are intended to mean that any such features are included in one or more embodiments of the present disclosure, but may or may not necessarily be combined in the same embodiments.

It is also important to note that the functions related to the improved dummy signal generation techniques as proposed herein illustrate only some of the possible functions that may be executed by, or within, systems illustrated in FIGURES. Some of these operations may be deleted or removed where appropriate, or these operations may be modified or changed considerably without departing from the scope of the present disclosure. In addition, the timing of these operations may be altered considerably. The preceding operational flows have been offered for purposes of example and discussion. Substantial flexibility is provided by embodiments described herein in that any suitable arrangements, chronologies, configurations, and timing mechanisms may be provided without departing from the teachings of the present disclosure.

Numerous other changes, substitutions, variations, alterations, and modifications may be ascertained to one skilled in the art and it is intended that the present disclosure encompass all such changes, substitutions, variations, alterations, and modifications as falling within the scope of the appended claims.

Note that all optional features of the apparatus described above may also be implemented with respect to the method or process described herein and specifics in the examples may be used anywhere in one or more embodiments.

What is claimed is:

1. A system for assisting in reducing data dependent noise in a digital-to-analog converter (DAC) unit of a DAC comprising a plurality of DAC units, the system comprising:
an arrangement configured to:
generate a time-series of dummy bits for a time-series of data bits to be provided to the DAC unit by, for each data bit, generating a dummy bit corresponding to the data bit as a bit having the same value as the data bit if the data bit is an even bit and as a bit having a value inverted from that of the data bit if the data bit is an odd bit, and
for each data bit, provide the data bit and the dummy bit corresponding to the data bit to the DAC unit in a single clock cycle.

2. The system according to claim 1, wherein the arrangement is configured to separate the time-series of data bits into a first and a second half-rate time-series of data bits so that all odd data bits are included into the first half-rate time-series of data bits and all even data bits are included into the second half-rate time-series of data bits.

3. The system according to claim 2, wherein generating the time-series of dummy bits comprises:
generating a first and a second half-rate time-series of dummy bits, where each dummy bit of the first half-rate time-series of dummy bits comprises a bit value that is an inversion of a corresponding data bit in the first half-rate time-series of data bits and each dummy bit of the second half-rate time-series of dummy bits comprises a bit value of a corresponding data bit in the second half-rate time-series of data bits.

4. The system according to claim 3, wherein generating the time-series of dummy bits further comprises:
serializing the first and the second half-rate time-series of dummy bits into the time-series of dummy bits clocked at a full-rate clock.

5. The system according to claim 2, further comprising a serializer for serializing the first and the second half-rate time-series of data bits into the time-series of data bits clocked at a full-rate clock.

6. The system according to claim 1, wherein the arrangement is configured to separate the time-series of data bits into a first, a second, a third, and a fourth quarter-rate time-series of data bits so that every second odd data bit is included into the third quarter-rate time-series of data bits and all remaining odd data bits are included into the first quarter-rate time series of data bits, and so that every second even data bit is included into the fourth quarter-rate time-series of data bits and all remaining even data bits are included into the second quarter-rate time series of data bits.

7. The system according to claim 6, wherein generating the time-series of dummy bits comprises:
generating a first, a second, a third, and a fourth quarter-rate time-series of dummy bits, where each dummy bit of the first quarter-rate time-series of dummy bits comprises a bit value that is an inversion of a corresponding data bit in the first quarter-rate time-series of data bits, each dummy bit of the second quarter-rate time-series of dummy bits comprises a bit value of a corresponding data bit in the second quarter-rate time-series of data bits, each dummy bit of the third quarter-rate time-series of dummy bits comprises a bit value that is an inversion of a corresponding data bit in the third quarter-rate time-series of data bits, and each dummy bit of the fourth quarter-rate time-series of dummy bits comprises a bit value of a corresponding data bit in the fourth quarter-rate time-series of data bits.

8. The system according to claim 7, wherein generating the time-series of dummy bits further comprises:
serializing the first, the second, the third, and the fourth quarter-rate time-series of dummy bits into the time-series of dummy bits clocked at a full-rate clock.

9. The system according to claim 6, further comprising a serializer for serializing the first, the second, the third, and the fourth quarter-rate time-series of data bits into the time-series of data bits clocked at a full-rate clock.

10. The system according to claim 1, wherein the arrangement configured to generate a time-series of dummy bits comprises an inverter configured to invert the data bit if the data bit is determined to be the odd bit.

11. A system for assisting in reducing data dependent noise in a digital-to-analog converter (DAC) unit of a DAC comprising a plurality of DAC units, the system comprising:
an arrangement configured to:
generate a time-series of dummy bits for a time-series of data bits to be provided to the DAC unit by, for each data bit, generating a dummy bit corresponding to the data bit as a bit having the same value as the data bit if the data bit is an odd bit and as a bit having a value inverted from that of the data bit if the data bit is an even bit, and
for each data bit, provide the data bit and the dummy bit corresponding to the data bit to the DAC unit in a single clock cycle.

12. The system according to claim 11, wherein the arrangement is configured to separate the time-series of data bits into a first and a second half-rate time-series of data bits so that all even data bits are included into the first half-rate time-series of data bits and all odd data bits are included into the second half-rate time-series of data bits.

13. The system according to claim 12, wherein generating the time-series of dummy bits comprises:
generating a first and a second half-rate time-series of dummy bits, where each dummy bit of the first half-rate time-series of dummy bits comprises a bit value that is an inversion of a corresponding data bit in the first half-rate time-series of data bits and each dummy bit of the second half-rate time-series of dummy bits comprises a bit value of a corresponding data bit in the second half-rate time-series of data bits.

14. The system according to claim 13, wherein generating the time-series of dummy bits further comprises:

serializing the first and the second half-rate time-series of dummy bits into the time-series of dummy bits clocked at a full-rate clock.

15. The system according to claim 12, further comprising a serializer for serializing the first and the second half-rate time-series of data bits into the time-series of data bits clocked at a full-rate clock.

16. The system according to claim 11, wherein the arrangement is configured to separate the time-series of data bits into a first, a second, a third, and a fourth quarter-rate time-series of data bits so that every second even data bit is included into the third quarter-rate time-series of data bits and all remaining even data bits are included into the first quarter-rate time series of data bits, and so that every second odd data bit is included into the fourth quarter-rate time-series of data bits and all remaining odd data bits are included into the second quarter-rate time series of data bits.

17. The system according to claim 16, wherein generating the time-series of dummy bits comprises:
generating a first, a second, a third, and a fourth quarter-rate time-series of dummy bits, where each dummy bit of the first quarter-rate time-series of dummy bits comprises a bit value that is an inversion of a corresponding data bit in the first quarter-rate time-series of data bits, each dummy bit of the second quarter-rate time-series of dummy bits comprises a bit value of a corresponding data bit in the second quarter-rate time-series of data bits, each dummy bit of the third quarter-rate time-series of dummy bits comprises a bit value that is an inversion of a corresponding data bit in the third quarter-rate time-series of data bits, and each dummy bit of the fourth quarter-rate time-series of dummy bits comprises a bit value of a corresponding data bit in the fourth quarter-rate time-series of data bits.

18. The system according to claim 11, wherein determining whether the data bit is an odd bit or an even bit comprises using a control signal indicating whether the data bit is an odd bit or an even bit.

19. A system for reducing data dependent noise in a digital-to-analog converter (DAC), the DAC comprising a plurality of DAC units, the system comprising:
a first dummy signal generator configured to:
receive a first data signal comprising a first time-series of data bits to be provided to a first DAC unit of the plurality of DAC units,
use an inverter to invert every other bit of the first time-series of data bits,
provide a first dummy signal as the first data signal with every other bit of the first time-series of data bits replaced with an inverted version of the bit,
wherein the system is configured to provide to the first DAC unit, in synchronization, the first dummy signal and the first data signal.

20. The system according to claim 19, further comprising:
a second dummy signal generator configured to:
receive a second data signal comprising a second time-series of data bits to be provided to a second DAC unit of the plurality of DAC units,
use an inverter to invert every other bit of the second time-series of data bits,
provide a second dummy signal as the second data signal with every other bit of the second time-series of data bits replaced with an inverted version of the bit, wherein the system is configured to provide to the second DAC unit, in synchronization, the second dummy signal and the second data signal.

21. The system according to claim 20, wherein the first DAC unit is a thermal DAC unit and the second DAC unit is a binary DAC unit.

22. A method for assisting in reducing data dependent noise in a digital-to-analog converter (DAC) unit of a DAC comprising a plurality of DAC units, the method comprising:
generating a time-series of dummy bits corresponding to a time-series of data bits by, for each data bit: generating a dummy bit corresponding to the data bit as a bit having the same value as the data bit if the data bit is an even bit and as a bit having a value inverted from that of the data bit if the data bit is an odd bit, or generating the dummy bit corresponding to the data bit as the bit having the same value as the data bit if the data bit is the odd bit and as the bit having the value inverted from that of the data bit if the data bit is the even bit; and
for each data bit, providing the data bit and the dummy bit corresponding to the data bit to the DAC unit in a single clock cycle.

23. The method according to claim 22, wherein, when the dummy bit is generated as the bit having the same value as the data bit if the data bit is the even bit and as the bit having the value inverted from that of the data bit if the data bit is the odd bit, the method further comprises:
separating the time-series of data bits into a first and a second half-rate time-series of data bits so that all odd data bits are included into the first half-rate time-series of data bits and all even data bits are included into the second half-rate time-series of data bits.

24. The method according to claim 23, wherein generating the time-series of dummy bits comprises:
generating a first and a second half-rate time-series of dummy bits, where each dummy bit of the first half-rate time-series of dummy bits comprises a bit value that is an inversion of a corresponding data bit in the first half-rate time-series of data bits and each dummy bit of the second half-rate time-series of dummy bits comprises a bit value of a corresponding data bit in the second half-rate time-series of data bits.

25. The method according to claim 22, wherein, when the dummy bit is generated as the bit having the same value as the data bit if the data bit is the even bit and as the bit having the value inverted from that of the data bit if the data bit is the odd bit, the method further comprises:
separating the time-series of data bits into a first, a second, a third, and a fourth quarter-rate time-series of data bits so that every second odd data bit is included into the third quarter-rate time-series of data bits and all remaining odd data bits are included into the first quarter-rate time series of data bits, and so that every second even data bit is included into the fourth quarter-rate time-series of data bits and all remaining even data bits are included into the second quarter-rate time series of data bits.

26. The method according to claim 25, wherein generating the time-series of dummy bits comprises:
generating a first, a second, a third, and a fourth quarter-rate time-series of dummy bits, where each dummy bit of the first quarter-rate time-series of dummy bits comprises a bit value that is an inversion of a corresponding data bit in the first quarter-rate time-series of data bits, each dummy bit of the second quarter-rate time-series of dummy bits comprises a bit value of a corresponding data bit in the second quarter-rate time-series of data bits, each dummy bit of the third quarter-rate time-series of dummy bits comprises a bit value that is an inversion of a corresponding data bit in the third quarter-rate time-series of data bits, and each dummy bit of the fourth quarter-rate time-series of dummy bits comprises a bit value of a corresponding data bit in the fourth quarter-rate time-series of data bits.

27. The method according to claim 22, wherein, when the dummy bit is generated as the bit having the same value as the data bit if the data bit is the odd bit and as the bit having the value inverted from that of the data bit if the data bit is the even bit, the method further comprises:
separating the time-series of data bits into a first and a second half-rate time-series of data bits so that all even data bits are included into the first half-rate time-series of data bits and all odd data bits are included into the second half-rate time-series of data bits.

28. The method according to claim 27, wherein generating the time-series of dummy bits comprises:
generating a first and a second half-rate time-series of dummy bits, where each dummy bit of the first half-rate time-series of dummy bits comprises a bit value that is an inversion of a corresponding data bit in the first half-rate time-series of data bits and each dummy bit of the second half-rate time-series of dummy bits comprises a bit value of a corresponding data bit in the second half-rate time-series of data bits.

29. The method according to claim 22, wherein, when the dummy bit is generated as the bit having the same value as the data bit if the data bit is the odd bit and as the bit having the value inverted from that of the data bit if the data bit is the even bit, the method further comprises:
separating the time-series of data bits into a first, a second, a third, and a fourth quarter-rate time-series of data bits so that every second even data bit is included into the third quarter-rate time-series of data bits and all remaining even data bits are included into the first quarter-rate time series of data bits, and so that every second odd data bit is included into the fourth quarter-rate time-series of data bits and all remaining odd data bits are included into the second quarter-rate time series of data bits.

30. The method according to claim 29, wherein generating the time-series of dummy bits comprises:
generating a first, a second, a third, and a fourth quarter-rate time-series of dummy bits, where each dummy bit of the first quarter-rate time-series of dummy bits comprises a bit value that is an inversion of a corresponding data bit in the first quarter-rate time-series of data bits, each dummy bit of the second quarter-rate time-series of dummy bits comprises a bit value of a corresponding data bit in the second quarter-rate time-series of data bits, each dummy bit of the third quarter-rate time-series of dummy bits comprises a bit value that is an inversion of a corresponding data bit in the third quarter-rate time-series of data bits, and each dummy bit of the fourth quarter-rate time-series of dummy bits comprises a bit value of a corresponding data bit in the fourth quarter-rate time-series of data bits.

* * * * *